(12) United States Patent
Kikuchi et al.

(10) Patent No.: US 7,103,819 B2
(45) Date of Patent: Sep. 5, 2006

(54) DECODING DEVICE AND DECODING METHOD

(75) Inventors: Atsushi Kikuchi, Kanagawa (JP); Masayuki Hattori, Kanagawa (JP)

(73) Assignee: Sony Corporation, Tokyo (JP)

( * ) Notice: Subject to any disclaimer, the term of this patent is extended or adjusted under 35 U.S.C. 154(b) by 132 days.

(21) Appl. No.: 10/493,739

(22) PCT Filed: Aug. 26, 2003

(86) PCT No.: PCT/JP03/10777

§ 371 (c)(1),
(2), (4) Date: Apr. 23, 2004

(87) PCT Pub. No.: WO2004/021578

PCT Pub. Date: Mar. 11, 2004

(65) Prior Publication Data

US 2005/0010846 A1  Jan. 13, 2005

(30) Foreign Application Priority Data

Aug. 27, 2002  (JP)  ............... 2002-247367

(51) Int. Cl.
*H03M 13/00* (2006.01)
(52) U.S. Cl. .................................... 714/752
(58) Field of Classification Search ................. 714/752
See application file for complete search history.

(56) References Cited

U.S. PATENT DOCUMENTS 6,938,196 B1 * 8/2005 Richardson et al. ........ 714/752

OTHER PUBLICATIONS

Akinori Ohashi et al., 'Performance of Low-Density Parity-Check (LDPC) Code with UMP BP-based Algorithm and Quantizer on Rayleigh Fading Channels', Technical Report of IEICE, RCS2002-56, May 24, 2002, pp. 31-36.

Zhang T. et al. 'On finite precision implementation of low density parity check codes decoder', Circuit and Systems, ISC AS 2001, The 2001 IEEE International Symposium, 2001, vol. 4, pp. 202-205.

Yu-Cheng He et al. 'Fast decoding of LDPC codes using quantisation', Electronics Letters, IEEE, vol. 38, No. 4, Feb. 14, 2002, pp. 189-190.

Jinghu Chen et al. 'Density evolution for BP-based decoding algorithms of LDPC codes and their quantized version', Global Telecommunications Conference, GLOBECOM '02, IEEE, Nov. 17-22, 2002, vol. 2, pp. 1378-1382.

(Continued)

*Primary Examiner*—Shelly Chase
(74) *Attorney, Agent, or Firm*—Finnegan, Henderson, Farabow, Garrett & Dunner, L.L.P.

(57) ABSTRACT

A decoding device that allows for high precision decoding of LDPC codes by optimizing the quantization width includes a distribution determining unit that determines a distribution of noise superposed on data received by a receiving unit, a quantization width determining unit that determines the quantization width that is optimized so that the error probability after decoding becomes the minimum with respect to the noise distribution determined by the distribution determining unit or the noise distribution determined by the distribution determining unit becomes the maximum with respect to a given error probability after decoding, a quantizing unit that quantizes the probability distribution of the received value received by the receiving unit with a predetermined low bit number according to the determined quantization width, and a message determining unit that determines a message as information bits based on the probability distribution of the received value quantized by the quantizing unit.

6 Claims, 15 Drawing Sheets

OTHER PUBLICATIONS

Gallager, R.G., "Low-Density Parity-Check Codes," M.I.T. Press, Cambridge, MA, 1963.

Luby, M.G., et al., "Analysis of low density codes and improved designs using irregular graphs," Proceedings of the 30th ACM STOC, May 23-26, 1998, also available at http://www.icsi.berkeley.edu/~luby/.

MacKay, D.J.C., "Good error correcting codes based on very sparse matrices," IEEE Trans. Inf. Theory, vol. 45, No. 2, Mar. 1999, pp. 391-431.

Chung, Sae-Young et al., "On the design of low-density parity-check codes within 0.0045 dB of the Shannon limit," IEEE Communications Letters, vol. 5, No. 2, Feb. 2001, pp. 58-60.

* cited by examiner

DECODING DEVICE AND DECODING METHOD

TECHNICAL FIELD

The present invention relates to a decoding device and a decoding method for decoding of low-density parity check codes.

BACKGROUND ART

Recently, for example, studies in the communication field, including mobile communication and deep space communication, and the broadcasting field, including terrestrial-wave broadcasting and satellite digital broadcasting, have advanced remarkably. With this advancement, studies on coding theory have also greatly advanced for the purpose of efficient error-correcting coding and decoding.

A known theoretical limit of code performance is the Shannon limit of the so-called Shannon's channel coding theorem (C. E. Shannon).

The goal of studies on coding theory is to develop coding that exhibits performance near the Shannon limit. A recently developed coding technique approaching the Shannon limit is a technique called Turbo coding, for example, parallel concatenated convolutional codes (PCCC) or serially concatenated convolutional codes (SCCC).

While such turbo codes have been developed, well-known coding of low-density parity check codes (hereinafter referred to as LDPC codes) has attracted attention.

The LDPC codes were first proposed by R. G. Gallager in R. G. Gallager, "Low-Density Parity-Check Codes", Cambridge, Mass.: M.I.T. Press, 1963, and were rediscovered in D. J. C. MacKay, "Good error correcting codes based on very sparse matrices", submitted to IEEE Trans. Inf. Theory, IT-45, pp. 399–431, 1999; M. G. Luby, N. Mitzenmacher, N. A. Shokrollahi, and D. A. Spielman, "Analysis of low density codes and improved designs using irregular graphs", Proceedings of the 30$^{th}$ ACM STOC. May 23–26, 1998.

Recent studies on the LDPC codes have found that, like the turbo codes, the performance approaches the Shannon limit as the code length increases. Due to the property that the minimum distance is in proportion to the code length, advantageously, the features of the LDPC codes are that the block error probability characteristics are better and the so-called error floor normally observed with decoding of turbo codes substantially does not occur.

The LDPC codes will be described hereinbelow in detail. The LDPC codes are linear codes, and are not necessarily binary; however, the following description will be made in the context of binary LDPC codes.

The greatest feature of the LDPC codes is that the codes are defined by a sparse check matrix. The sparse matrix means that the number of "1s" in this matrix is very small, and may be, for example, a sparse check matrix represented by "H", shown in FIG. 14, of which the Hamming weight of each column is 3 and the Hamming weight of each row is 6.

The LDPC codes defined by the check matrix H of which the Hamming weights of each row and column are constant are referred to as regular LDPC codes. On the other hand, the LDPC codes defined by the check matrix H of which the Hamming weights of each row and column are not constant are referred to as irregular LDPC codes.

Coding of the LDPC codes is implemented by generating a generator matrix G based on the check matrix H and by multiplying the generator matrix G by a binary-valued information message to generate a codeword. More specifically, an encoder for performing coding of LDPC codes first determines a generator matrix G which satisfies $GH_T=0$ between a transposed matrix $H_T$ of the check matrix H and the generator matrix G to be determined. Where the generator matrix G has a k×n matrix, the encoder multiplies the generator matrix G by an information message of k bits to generate a codeword of n bits. The codeword generated by the encoder is mapped so that a code bit of value "0" is converted into "+1" and a code bit of value "1" is converted into "−1" for transmission. The transmitted codeword is received by a decoder via a predetermined communication channel.

Decoding of the LDPC codes can be implemented by the "Probabilistic Decoding" algorithm proposed by Gallager described above, which is a message-passing algorithm based on belief propagation operating on a so-called Tanner graph consisting of variable nodes (also referred to as message nodes) and check nodes. In the "Probabilistic Decoding", however, messages exchanged among the nodes are real numbers, and it is therefore necessary to monitor the probability distribution itself of the messages of sequential numbers in order to analytically solve the messages. Thus, very difficult analysis is required.

Therefore, Gallager has proposed algorithm A or algorithm B as an algorithm for decoding LDPC codes.

In general, decoding of LDPC codes is performed according to the procedure shown in FIG. 15. In this example, the received value is represented by $U_0(u_{0i})$, the message output from a check node is represented by $u_j$, and the message output from a variable node is represented by $v_i$. Each message is a real number whose "0" likelihood is expressed by the so-called log likelihood ratio.

In the decoding of LDPC codes, as shown in FIG. 15, first, in step S11, upon reception of the received value $U_0(u_{0i})$, the message $u_j$ is set to "0" and an integer k of an iterative decoding counter is also set to "0".

In the decoding of LDPC codes, then, in step S12, the message $v_i$ is determined by computation given by Eq. (1) below based on the received value $U_0(u_{0i})$, and the message $u_j$ is determined by computation given by Eq. (2) below based on the determined message $v_i$. Then, in the decoding of LDPC codes, the integer k is incremented by "1".

$$v_i = u_{0i} + \sum_{j=1}^{dv-1} u_j \tag{1}$$

$$\tanh\left(\frac{u_j}{2}\right) = \prod_{i=1}^{dc-1} \tanh\left(\frac{v_i}{2}\right) \tag{2}$$

In Eqs. (1) and (2), dv and dc are arbitrarily selectable parameters representing the number of "1s" in the vertical direction (column) and the horizontal direction (row) of the check matrix H described above, respectively. For example, in case of a (3, 6) code, dv=3 and dc=6. In Eqs. (1) and (2), the messages input from edges that are to output the messages are not used as product or sum parameters, and the product or sum ranges are up to dv-1 and dc-1. In practice, the computation given by Eq. (2) is performed by preparing in advance a table of functions R given by Eq. (3) below, defined by one output with respect to two inputs $v_1$ and $v_2$ and by sequentially using the functions R as in Eq. (4) as follows:

$$x = 2 \tan h^{-1}\{\tan h(v_1/2)\tan h(v_2/2)\} = R(v_1, v_2) \tag{3}$$

$$u_j = R(v_1, R(v_2, R(v_3, \ldots R(v_{dc-2}, v_{dc-1})))) \tag{4}$$

Then, in the decoding of LDPC codes, in step S13, it is determined whether or not the integer k is greater than N.

In the decoding of LDPC codes, if it is determined that the integer k is not greater than N, the processing from step S12 is repeated; if it is determined that the integer k is greater than N, the process proceeds to step S14.

Then, in the decoding of LDPC codes, in step S14, the message $v_i$ as a decoding result to be finally output is determined by computation given by Eq. (5) below, and the result is output. Then, the series of processing steps ends. Unlike Eq. (1), Eq. (5) below is calculated using the messages input from all connected edges.

$$v_i = u_{0i} + \sum_{j=1}^{dv} u_j \quad (5)$$

In such decoding of LDPC codes, for example, in the case of a (3, 6) code, as shown in FIG. 16., messages are exchanged between nodes. The computation given by Eq. (1) is performed in the nodes indicated by "=" shown in FIG. 16, and the computation given by Eq. (2) is performed in the nodes indicated by "+". Particularly in the algorithm A described above, messages are binarized, and the (dc-1) input messages are exclusive ORed by the "+" nodes, and, if all bit values of the (dv-1) input messages are different from the received value R, the inverted version of the codes is output by the "=" nodes.

In the decoding of LDPC codes, a received value must be initially quantized. In a case where the received value or a message exchanged between nodes is expressed with a low bit number, it is known that the performance changes depending upon the setting of the quantization width.

Typically, decoding of LDPC codes for a low bit number is performed according to the procedure shown in FIG. 17.

In the decoding of LDPC codes, as shown in FIG. 17, first, in step S21, upon reception of the received value $U_0(u_{0i})$, the received value $U_0(u_{0i})$ is quantized with a low bit number, the message $v_i$ is set to "$u_{0i}$", and an integer k of an iterative decoding counter is set to "0". In the decoding of LDPC codes, for example, when messages are to be expressed with 2 bits, the received value $U_0(u_{0i})$ is quantized to 3 bits. In the decoding of LDPC codes, the received value $U_0(u_{0i})$ quantized to 3 bits is then quantized to 2 bits for use in determining the message $v_i$.

Then, in the decoding of LDPC codes, in step S22, the message $u_j$ is determined based on the message $v_i$, and the message $v_i$ is further determined based on the received value $U_0(u_{0i})$ and the determined message $u_j$ by computation given by Eq. (1). Then, in the decoding of LDPC codes, the integer k is incremented by "1".

In the decoding of LDPC codes, as described above, a table of single-output functions of low bit number is produced from two low-bit inputs $v_1$ and $v_2$ in advance, and this table is iteratively used to determine the low-bit message $u_j$. In the decoding of LDPC codes, the message $v_i$, which is determined using Eq. (1), causes the bit number to increase, and therefore quantization to 2 bits is performed.

Then, in the decoding of LDPC codes, in step S23, it is determined whether or not the integer k is greater than N.

In the decoding of LDPC codes, if it is determined that the integer k is not greater than N, the processing from step S22 is repeated; if it is determined that the integer k is greater than N, the process proceeds to step S24.

Then, in the decoding of LDPC codes, in step S24, the message $v_i$ to be finally output as a result of decoding is determined, and the result is output. Then, the series of processing steps ends.

In such decoding of LDPC codes, the performance changes depending upon the quantization width for quantization of a received value and messages exchanged between nodes. Furthermore, in the decoding of LDPC codes, the quantization width for determination of the message $v_i$ using Eq. (1) also affects the error correction performance.

However, in the decoding of LDPC codes, performance evaluation is not performed based on the quantization width, and optimization of the quantization width has not been suggested. In the decoding of LDPC codes, therefore, optimization of the quantization width would admit an improvement in code performance.

The present invention has been made in view of such a situation, and it is an object of the present invention to provide a decoding device and a decoding method that optimize the quantization width to improve the code performance, thus allowing for high-precision decoding of LDPC codes.

DISCLOSURE OF INVENTION

In order to achieve the above-described object, a decoding device according to the present invention is a decoding device that decodes a code encoded by low-density parity check coding, including receiving means for receiving data as a received value, distribution determining means for determining a distribution of noise that is superposed on the data received by the receiving means, quantization width determining means that determines a quantization width that is optimized so that an error probability after decoding becomes the minimum with respect to the noise distribution determined by the distribution determining means or the noise distribution determined by the distribution determining means becomes the maximum with respect to a given error probability after decoding, quantizing means for quantizing a probability distribution of the received value received by the receiving means with a predetermined low bit number according to the quantization width determined by the quantization width determining means, and message determining means for determining a message as information bits based on the probability distribution of the received value quantized by the quantizing means.

In the decoding device according to the present invention, the probability distribution of the received value is quantized by the quantizing means with a predetermined low bit number according to the quantization width that is optimized so that the error probability after decoding becomes the minimum with respect to a given noise distribution or the noise distribution becomes the maximum with respect to a given error probability after decoding, and decoding is performed by the message determining means based on the probability distribution of the received value quantized by the quantizing means.

In order to achieve the above-described object, furthermore, a decoding method according to the present invention is a decoding method for decoding a code encoded by low-density parity check coding, including a receiving step of receiving data as a received value, a distribution determining step of determining a distribution of noise that is superposed on the data received in the receiving step, a quantization width determining step of determining a quantization width that is optimized so that an error probability after decoding becomes the minimum with respect to the noise distribution determined in the distribution determining step or the noise distribution determined in the distribution determining step becomes the maximum with respect to a given error probability after decoding, a quantizing step of quantizing a probability distribution of the received value received in the receiving step with a predetermined low bit number according to the quantization width determined in the quantization width determining step, and a message determining step of determining a message as information bits based on the probability distribution of the received value quantized in the quantizing step.

In the decoding method according to the present invention, the probability distribution of the received value is quantized with a predetermined low bit number according to the quantization width that is optimized so that the error probability after decoding becomes the minimum with respect to a given noise distribution or the noise distribution becomes the maximum with respect to a given error probability after decoding, and decoding is performed based on the quantized probability distribution of the received value.

BRIEF DESCRIPTION OF THE DRAWINGS

FIGS. 2A and 2B are plots showing quantization of an initial message, in which FIG. 2A shows a probability distribution of the initial message and FIG. 2B shows quantization so that the probability distribution shown in FIG. 2A is divided into a plurality of regions.

BEST MODE FOR CARRYING OUT THE INVENTION

A specific embodiment of the present invention will be described in detail with reference to the drawings.

Figure 1:
FIG. 1 is a block diagram showing the configuration of a communication model implementing a data transmission and reception system according to an embodiment of the present invention.

As shown in FIG. 1, this embodiment provides a data transmission and reception system implemented by a communication model for encoding digital information by an encoding device 1 of a transmitting apparatus (not shown) and inputting the digital information output from the encoding device 1 to a receiving apparatus (not shown) via a predetermined noisy communication channel 2 to decode the digital information by a decoding device 3 of this receiving apparatus.

In this data transmission and reception system, the encoding device 1 performs coding of low-density parity check codes (hereinafter referred to as LDPC codes). In particular, the encoding device 1 is capable of optimizing the degree sequence, as described below, when the decoding device 3 expresses a received value and messages exchanged between nodes with a low bit number, thus allowing for an improvement in code performance.

The decoding device 3 performs decoding of codes encoded by the encoding device 1 and performs iterative decoding. In particular, the decoding device 3 is capable of optimizing the quantization width for expressing a received value and messages exchanged between nodes with a low bit number, thus allowing for high-precision decoding of LDPC codes.

Prior to a description of the specific structure of the data transmission and reception system, analysis results that help suggest encoding and decoding processing of the present data transmission and reception system will be described.

First, results of analysis on quantizer optimization in decoding processing will be described.

The analysis of decoding processing in which an initial message, i.e., a received value, is expressed with 3 bits and the subsequent messages are expressed with 2 bits is performed using a so-called density evolution technique, which is described in, for example, Sae-Young Chung, G. David Forney, Jr., Thomas J. Richardson, and Rudiger Urbanke, "On the design of low-density parity-check codes within 0.0045 dB of the Shannon limit", to appear in IEEE Communications Letters.

First, a regular, so-called (3, 6) code, i.e., a code of dv=3 and dc=6, is analyzed.

Where the message output from a variable node is represented by V and the message output from a check node is represented by U, the message V is given by Eq. (6) as follows:

$$V = \sum_{j=0}^{dv-1} U_j \quad (6)$$

In Eq. (6), message $U_0$ is an initial message, and messages $U_j$ (j=1, 2, ..., dv-1) are messages input from adjacent variable nodes. The message U is given by Eq. (7) as follows:

$$\tanh\left(\frac{U}{2}\right) = \prod_{i=1}^{dc-1} \tanh\left(\frac{V_i}{2}\right) \quad (7)$$

Figure 2A:
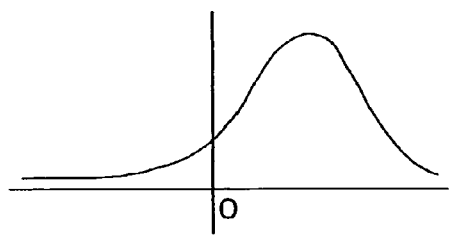
Figure 2B:
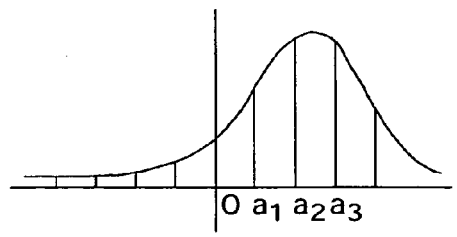

When the real-number initial message, which is expressed by the so-called log likelihood ratio, is quantized to 3 bits, a positive probability distribution and a negative probability distribution of the initial message are each divided into four regions. That is, in the case of the probability distribution of the initial message shown in FIG. 2A, quantization is performed so that the probability distribution is divided into eight regions, as shown in FIG. 2B. In FIGS. 2A and 2B, the x-axis indicates the log likelihood ratio and the y-axis indicates the probability. The log likelihood ratio is divided at three points in the positive portion, and these values, i.e., the quantization widths, are represented by $a_1$, $a_2$, and $a_3$. Division in the negative portion is symmetric to that in the positive portion. The message $U_0$ is 3 bits with values 0 to 7, and the messages $U_j$ other than the initial message $U_0$ are each 2 bits with values 0 to 3.

In density evolution, when dv=3, the probability distribution $P_v$ of the message $V_i$ is determined by convolutional computation given by Eq. (8) below using the probability distribution $P_{u0}$ (j) (j=0, 1, ..., 7) of the message $U_0$ and the probability distribution $P_u(j)$ (j=0, 1, 2, 3) of the messages $U_j$ input from the check nodes. In Eq. (8) as follow, * denotes the convolution operator.

$$P_v = P_{u0} * P_u * P_u \quad (8)$$

The convolutional computation give by Eq. (8) is implemented like polynomial multiplication. The determined probability distribution $P_v$ has values 0 to 13. In density evolution, the message represented by the probability distribution $P_v$ is quantized to 2 bits to produce a message V to be output from a variable node.

The computation given by Eq. (7) will now be described. When dc=6, the variable node is the 5-input single-output node. The message $V_i$ output from this variable node is 2 bits with values 0 to 3. The values 0 and 1 are associated with negative log-likelihood ratio values, and the values 2 and 3 are associated with positive log-likelihood ratio values. Thus, the variable node outputs value "0" or "1" when the input messages contain an odd number of "0s" or "1s", and output value "2" or "3" when the input messages contain an even number of "0s" or "1s". When at least one "1" or "2" is contained, the variable node outputs value "1" or "2".

In density evolution, when such a rule is established, the following calculation is carried out:

First, as given by Eq. (9) below, a single-output function R for the message U in Eq. (7) is defined by two inputs:

$$V_3 = R(V_1, V_2) \quad (9)$$

The 2-bit message $V_3$, given by Eq. (9), represented by the function R is determined by referring to a table, e.g., Table 1 below, which is produced in advance:

TABLE 1

Conversion Table for Eq. (9)

| $V_1$ | $V_2$ | | | |
|---|---|---|---|---|
|  | 0 | 1 | 2 | 3 |
| 0 | 3 | 2 | 1 | 0 |
| 1 | 2 | 2 | 1 | 1 |
| 2 | 1 | 1 | 2 | 2 |
| 3 | 0 | 1 | 2 | 3 |

Thus, one-output ($U_5$) with respect to five inputs ($V_1$, $V_2$, $V_3$, $V_4$, $V_5$), given by Eq. (7), is determined by iterations of the computation given by Eq. (9) using Table 1, as given by Eq. (10) as follows:

$$U_5 = R(V_5, R(V_4, R(V_3, R(V_2, V_1)))) \quad (10)$$

In density evolution, where the probability distributions of the messages $V_1$ and $V_2$ are represented by $P_1(i)$ and $P_2(i)$ (i=0, 1, 2, 3), respectively, the computation given by Eq. (9) corresponds to computations given by Eq. (11) as follows:

$$\begin{cases} P_3(0) = P_1(0)P_2(3) + P_1(3)P_2(0) \\ P_3(1) = P_1(0)P_2(2) + P_1(1)\{P_2(2) + P_2(3)\} + P_1(2)\{P_2(0) + P_2(1)\} + P_1(3)P_2(1) \\ P_3(2) = P_1(0)P_2(1) + P_1(1)\{P_2(0) + P_2(1)\} + P_1(1)\{P_2(2) + P_2(3)\} + P_1(3)P_2(2) \\ P_3(3) = P_1(0)P_2(0) + P_1(3)P_2(3) \end{cases}$$

In density evolution, assuming that the probability distribution of the input message V is represented by $P_v$, the probability distribution $P_u$ of the message U given by Eq. (10) is given by Eq. (12) as follows:

$$P_u = R(P_v, R(P_v, R(P_v, R(P_v, P_v)))) \quad (12)$$

In Eq. (11), normally, the computation given by Eq. (10) using Table 1 needs to be performed four times; however, as given by Eqs. (13) through (15) below, only three computations are required:

$$P_2 = R(P_v, P_v) \quad (13)$$

$$P_4 = R(P_2, P_2) \quad (14)$$

$$P_u = R(P_v, P_4) \quad (15)$$

The result of Eq. (15) equals the result of Eq. (12). In density evolution, therefore, the probability distribution $P_u$ of 2-bit data is determined from the probability distribution $P_v$.

Example analyses using the density evolution described above will now be shown. Analyses are performed for a 3-bit initial message $U_0$ in a case where the quantization widths $a_1$, $a_2$, and $a_3$ are optimized and in a case where the quantization widths $a_1$, $a_2$, and $a_3$ are arranged with equal intervals, and an analysis is performed for a 2-bit initial message $U_0$ in a case where only the quantization width $a_1$ is optimized.

First, an analysis is performed in a case where the quantization widths $a_1$, $a_2$, and $a_3$ are optimized when the initial message $U_0$ is 3 bits. The computation is performed in a range of the log likelihood ratio from −25 to +25.

Figure 3:
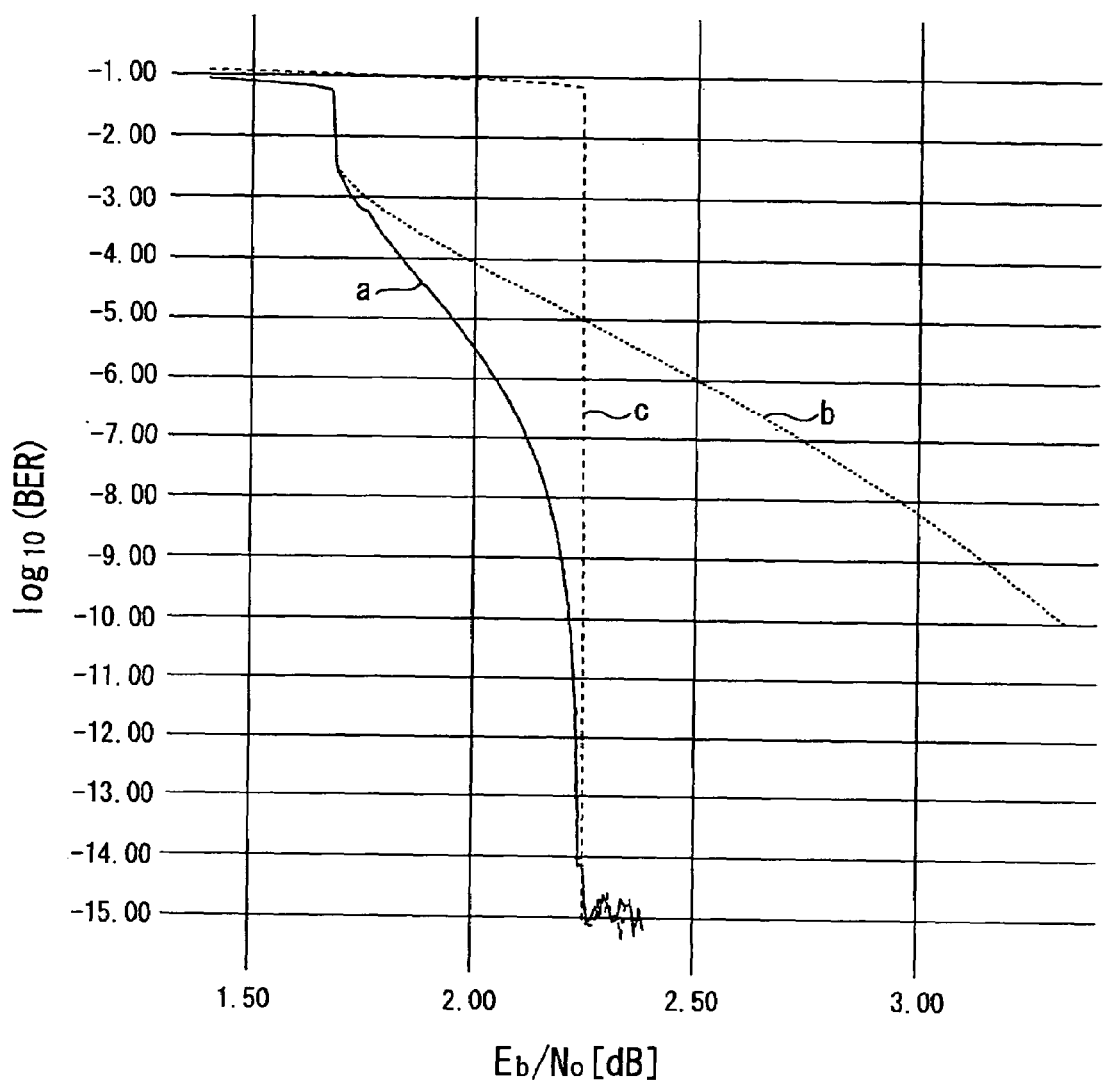
FIG. 3 is a plot of analysis results showing the relationship between the signal-to-noise power ratio $E_b/N_0$ and the base-10 logarithm of the error probability after decoding ($\log_{10}$ BER) in order to optimize the quantization width.

In order to obtain the 3-bit initial message $U_0$, the quantization widths $a_1$, $a_2$, and $a_3$ must be set as required. In this example, given a signal-to-noise power ratio $E_b/N_0$ [dB] or a noise distribution σ per bit, the quantization widths $a_1$, $a_2$, and $a_3$ are optimized so as to provide the best error correction performance. As a result of analysis, the curve indicated by a solid line "a" shown in FIG. 3 is obtained. In FIG. 3, the x-axis indicates the signal-to-noise power ratio $E_b/N_0$, and the y-axis indicates the base-10 logarithm of the error probability after decoding ($\log_{10}$ BER) The noise distribution σ and the error probability $P_b$ before error correction with respect to the signal-to-noise power ratio $E_b/N_0$ on the x-axis are shown in Table 2 as follows:

TABLE 2

Relationship between $E_b/N_0$, σ, and $P_b$

| $E_b/N_0$ | 1.50 | 2.00 | 2.50 | 3.00 |
|---|---|---|---|---|
| σ | 0.8414 | 0.7943 | 0.7499 | 0.7080 |
| $P_b$ | 0.1173 | 0.1040 | 0.0912 | 0.0789 |

In FIG. 3, the threshold of the noise distribution σ is unclear. More specifically, when the noise distribution σ is 0.8237, the error probability $P_b$ before error correction is 0.1123, and the error probability after error correction is reduced to 0.004533, but is not reduced to 0. The quantization widths $a_1$, $a_2$, and $a_3$ are 1.46, 2.91, and 4.57, respectively. The quantization widths $a_1$, $a_2$, and $a_3$ have substantially the same intervals therebetween, and the relationship given by Eq. (16) is determined as follows:

$$\begin{cases} a_2 \cong 2 \cdot a_1 \\ a_3 \cong 3 \cdot a_1 \end{cases} \quad (16)$$

It can also be seen from FIG. 3 that, as the noise distribution σ decreases, the error probability after error correction also decreases but does not have a threshold that approaches 0. The quantization widths $a_1$, $a_2$, and $a_3$ are far from the state in which they have substantially the same intervals therebetween. For example, when σ=0.776, the error probability $P_b$ before error correction is 0.0988, and the error probability after error correction is 5.94×10$^{-10}$. The quantization widths $a_1$, $a_2$, and $a_3$ are 1.75, 8.02, and 21.6, respectively. The probability distribution $P_v$ given by Eq. (8) has values from 0 to 13, as described above, and is quantized to 2 bits using Eq. (17) as follows:

$$\begin{cases} V(0) = \sum_{i=0}^{5} P_v(i) \\ V(1) = P_v(6) \\ V(2) = P_v(7) \\ V(3) = \sum_{i=8}^{13} P_v(i) \end{cases} \quad (17)$$

Calculation of $V(1)=P_v(6)+P_v(5)$ and $V(2)=P_v(7)+P_v(8)$ as a quantizing method exhibits a tendency to significantly deteriorate the error correction performance.

Next, an analysis is performed in a case where the quantization widths $a_1$, $a_2$, and $a_3$ have the same intervals. That is, an analysis is performed where the initial message $U_0$ is still 3 bits under the additional conditions that $a_2=2 \cdot a_1$ and $a_3=3 \cdot a_1$. In this case, therefore, the optimization parameter for providing the best error correction performance is only the quantization width $a_1$. As a result of analysis, the curve indicated by a broken line "b" shown in FIG. 3 is obtained.

It can be seen from FIG. 3 that a similar curve to that indicated by the solid line "a" in FIG. 3 is exhibited until the signal-to-noise power ratio $E_b/N_0$ is about 1.8 dB; however, the error correction performance deteriorates when the signal-to-noise power ratio $E_b/N_0$ becomes greater than 1.8 dB.

Next, an analysis is performed in a case where only the quantization width $a_1$ is optimized so as to provide the best error correction performance when the initial message $U_0$ is 2 bits. Since the positive probability distribution of the initial message $U_0$ is divided into two portions $U_0(2)$ and $U_0(3)$, only the dividing point is the value $a_1$. As a result of optimization of the quantization width $a_1$ so as to provide the best error correction performance, the curve indicated by a broken line "c" shown in FIG. 3 is obtained.

It can be seen from FIG. 3 that the noise distribution σ has a threshold, and the threshold is σ=0.7725. The quantization width $a_1$ is 1.755. In case of the 2-bit message, the probability distribution $P_v$ given by Eq. (8) has values 0 through 9, and is quantized to 2 bits using equations corresponding to Eq. (17), where $V(1)=P_v(4)$, $V(2)=P_v(5)$, the sum of the remaining $P_v(0)$ to $P_v(3)$ equals $V(0)$, and the sum of the remaining $P_v(6)$ to $P_v(9)$ equals $V(3)$.

From the analysis results described above, in the decoding of LDPC codes, there is an optimum quantization width depending upon the value of the noise distribution σ. In the decoding of LDPC codes, therefore, preferably, the initial message or the message output from the variable node is quantized using the quantization width that is set so that the error probability after decoding becomes the minimum with respect to a given noise distribution σ. In other words, in the decoding of LDPC codes, preferably, the quantization width is set so that the noise distribution σ becomes the maximum with respect to a given error probability after decoding.

In view of such analysis results, the decoding device 3 of the receiving apparatus in the data transmission and reception system may be configured in the manner described below.

Figure 4:
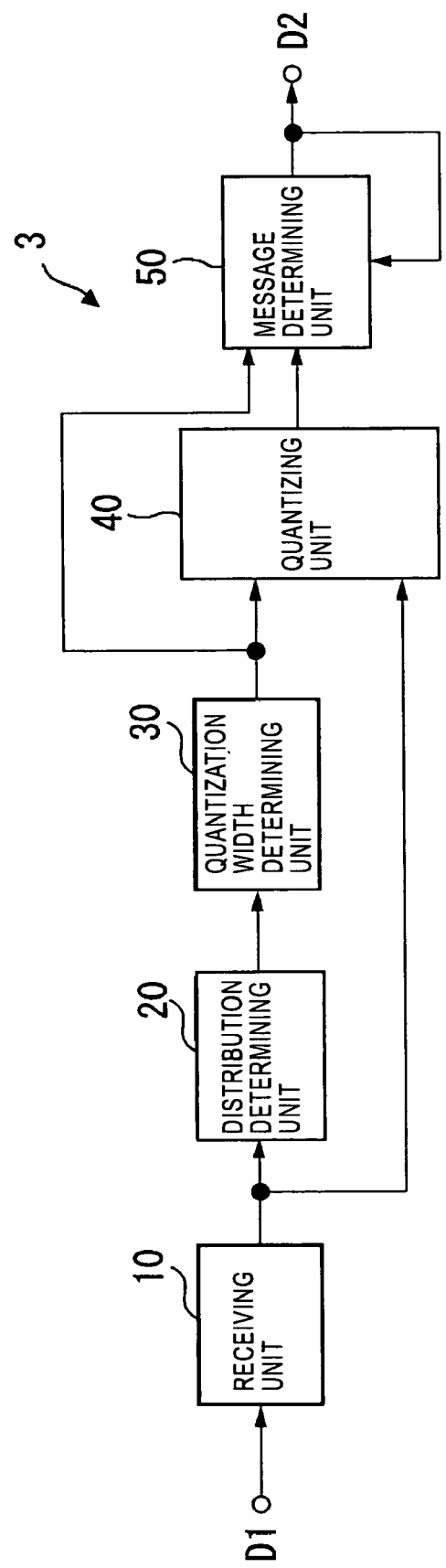
FIG. 4 is a block diagram showing the structure of a decoding device in the data transmission and reception system.

For example, as shown in FIG. 4, the decoding device 3 includes a receiving unit 10 that receives data D1 sent from the transmitting apparatus via the communication channel 2, a distribution determining unit 20 that determines distribution σ of noise that is superposed on the data D1 received by the receiving unit 10, a quantization width determining unit 30 that determines the quantization width that is optimized based on the noise distribution σ determined by the distribution determining unit 20, a quantizing unit 40 that quantizes the probability distribution $P_{u0}$ of the received value received by the receiving unit 10, and a message determining unit 50 that determines a message as information bits based on the probability distribution $P_{u0}$ of the received value quantized by the quantizing unit 40. The decoding device 3 estimates the data input to the encoding device 1 based on the received value that takes a real value due to noise caused on the communication channel 2, and outputs decoded data D2.

The receiving unit 10 receives as a received value the data D1 sent from the transmitting apparatus via the communication channel 2. The receiving unit 10 supplies the received value to the distribution determining unit 20 and the quantizing unit 40.

The distribution determining unit 20 determines distribution σ of noise that is superposed on the data D1 received by the receiving unit 10. The distribution determining unit 20 supplies information indicating the value of the determined noise distribution σ to the quantization width determining unit 30.

The quantization width determining unit 30 determines the optimum quantization width based on the noise distribution σ determined by the distribution determining unit 20. That is, the quantization width determining unit 30 determines the quantization width so that the error probability after decoding becomes the minimum with respect to the noise distribution σ determined by the distribution determining unit 20. Alternatively, the quantization width determining unit 30 may determine the quantization width so that the noise distribution σ becomes the maximum with respect to a given error probability after decoding. The quantization width determining unit 30 supplies information indicating the value of the quantization width determined for the received value to the quantizing unit 40, and also supplies information indicating the value of the quantization width determined for the message output from the variable node to the message determining unit 50.

The quantizing unit 40 quantizes the probability distribution $P_{u0}$ of the received value received by the receiving unit 10 according to a predetermined low bit number. For example, when the message is to be expressed with 2 bits, the quantizing unit 40 quantizes the probability distribution $P_{u0}$ of the received value to 3 bits. The quantizing unit 40 performs the quantization using the quantization width determined by the quantization width determining unit 30. The quantizing unit 40 supplies the quantized received value to the message determining unit 50.

The message determining unit 50 iterates a series of decoding operations a predetermined number of times in which the message to be output from a variable node is determined based on the received value supplied from the quantizing unit 40 and the message to be output from a check node is also determined based on the determined message, thereby determining a message as information bits. More specifically, the message determining unit 50 determines the message by a series of steps shown in FIG. 5.

Figure 5:
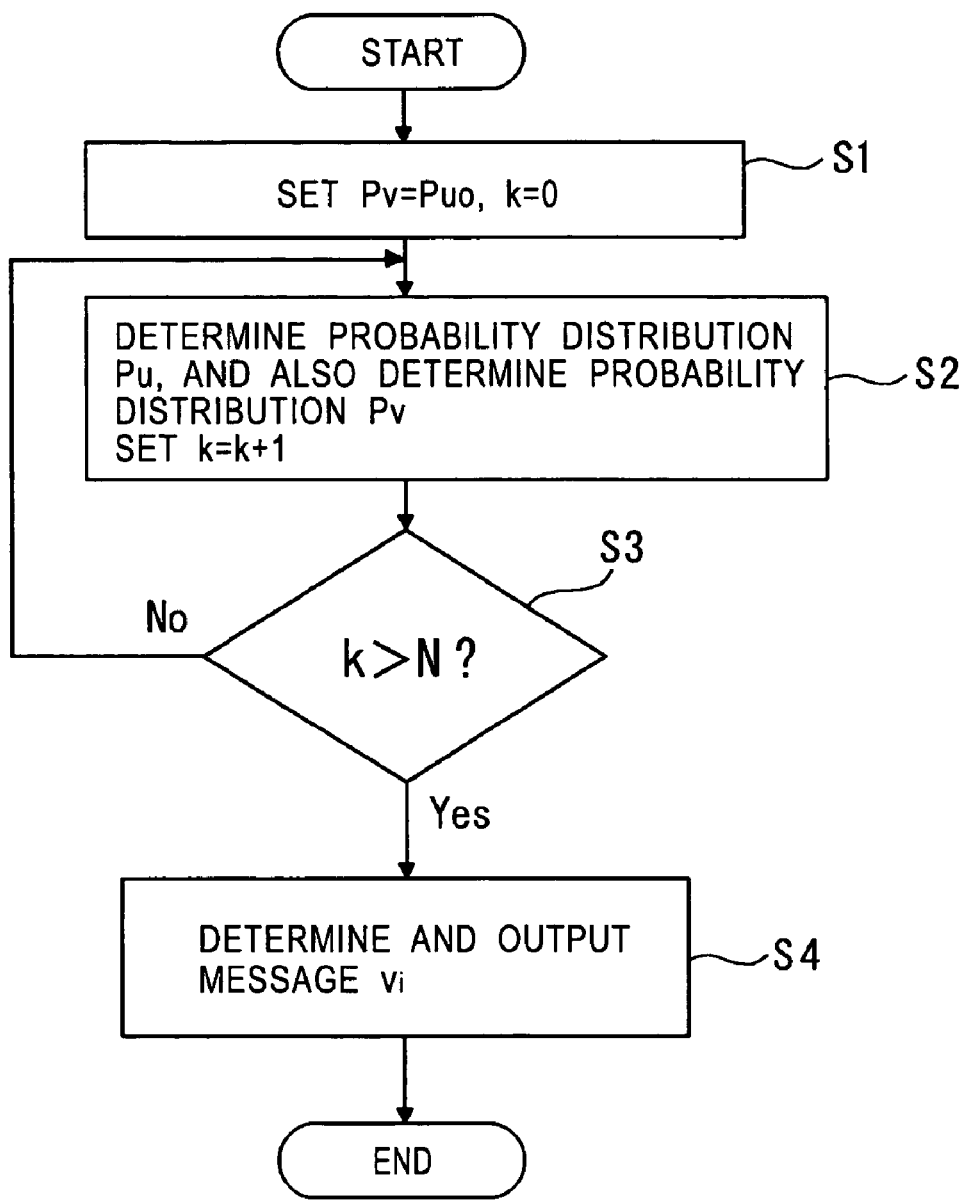
FIG. 5 is a flowchart showing a series of steps of determining and outputting a message by a message determining unit of the decoding device.

As shown in FIG. 5, first, in step S1, the probability distribution $P_{u0}$ of the received value quantized by the quantizing unit 40 is further quantized by the message determining unit 50 to determine the probability distribution $P_v$ of the message $v_i$ to be output from a variable node, and the integer k of an iterative processing counter is set to "0". For example, when the message is to be expressed with 2 bits, the message determining unit 50 quantizes the probability distribution $P_{u0}$ of the received value, which has been quantized to, for example, 3 bits, to 2 bits to determine the probability distribution $P_v$.

Then, in step S2, the message determining unit 50 determines the probability distribution $P_u$ of the message $u_j$ output from a check node based on the probability distribution $P_v$, and also determines the probability distribution $P_v$ of the message $v_i$ based on the probability distribution $P_{u0}$ of the received value and the determined probability distribution $P_u$ of the message $u_j$ by performing the computation given by Eq. (8). Then, in the decoding of LDPC codes, the integer k is incremented by "1".

The message determining unit 50 produces a table of single-output functions of low bit number from two low-bit inputs $v_1$ and $v_2$ in advance, and iteratively uses this table as given by Eq. (12) to determine the probability distribution $P_u$ of the low-bit message $u_j$. Since the bit number increases if the probability distribution $P_v$ of the message $v_i$ is determined by Eq. (8), the message determining unit 50 quantizes it to 2 bits. The message determining unit 50 performs the quantization using the quantization width determined by the quantization width determining unit 30.

Then, in step S3, the message determining unit 50 determines whether or not the integer k is greater than N.

If the message determining unit 50 determines that the integer k is not greater than N, the processing from step S2 is repeated; if it is determined that the integer k is greater than N, the process proceeds to step S4.

Then, in step S4, the message determining unit 50 determines and outputs the message $v_i$ to be finally output as a result of decoding. Then, the series of processing steps ends.

The message determining unit 50 outputs the message determined by the series of steps described above, as the decoded data D2, to an external device.

The decoding device 3 performs iterative decoding of the data D1 encoded and sent by the encoding device 1, thus constantly improving the code characteristics with high decoding complexity, and outputs the decoded data D2 as a result of decoding a predetermined number of times.

In the decoding device 3, the quantization width determining unit 30 determines the quantization width so that the error probability after decoding becomes the minimum with respect to the noise distribution σ determined by the distribution determining unit 20, and, using this determined quantization width of low bit number, the quantizing unit 40 quantizes the received value and the message determining unit 50 quantizes the message.

Therefore, the decoding device 3 improves the code performance and achieves high-precision decoding.

Next, results of analysis on degree sequence optimization in coding of irregular LDPC codes will be described.

In an irregular LDPC code, a check matrix is defined by the so-called degree sequence. The degree sequence represents the distribution of "1s" in a check matrix. The distribution of "1s" in the vertical direction (column) of the check matrix is represented by function λ(x) given by Eq. (18) below, and the distribution of "1s" in the horizontal direction (row) of the check matrix is represented by function ρ(x) given by Eq. (19) below:

$$\lambda(x) = \Sigma \lambda_i x^{n_i} \tag{18}$$

$$\rho(x) = \Sigma \rho_i x^{m_i} \tag{19}$$

The order $n_i$ of the function λ(x), which corresponds to dv, as described above, representing the number of "1s" in the vertical direction (column) of the check matrix of a regular LDPC code, is only an odd number. This is because, if the order $n_i$ is an even number, the probability distribution $P_u$ in the convolutional computation given by Eq. (8) is an odd number, thus causing a value with a log likelihood ratio of 0, leading to an inability to quantize to 2 bits. On the other hand, the order $m_i$ of the function $\rho(x)$, which corresponds to dc, as described above, representing the number of "1s" in the horizontal direction (row) of the check matrix of the regular LDPC code, is either an odd number or an even number. In this example, the function $\lambda(x)$ is expressed by a polynomial that is a sum of two terms, whose order $n_i$ is 3 and an arbitrary odd number n, as given by Eq. (20) below, and the function $\rho(x)$ is also expressed by a polynomial that is a sum of two terms, as given by Eq. (21) below. In Eq. (20), the coefficient $\lambda(3)$ represents the proportion of three "1s" in the vertical direction (column) of the check matrix, and the coefficient $\lambda(n)$ represents the proportion of n "1s" in the vertical direction (column) of the check matrix. In Eq. (21), the coefficient $\rho(m)$ represents the proportion of m "1s" in the horizontal direction (row) of the check matrix, and the coefficient $\rho(m+1)$ represents the proportion of m+1 "1s" in the horizontal direction (row) of the check matrix.

$$\lambda(x)=\lambda(3)x^3+\lambda(n)x_n$$

where $\lambda(3)+\lambda(n)=1$ (20)

$$\rho(x)=\rho(m)x^m+\rho(m+1)x^{m+1}$$

where $\rho(m)+\rho(m+1)=1$ (21)

When the code rate is ½, the requirement given by Eq. (22) is added as follows:

$$\frac{1}{2}[(\lambda(3)/3)+(\lambda(n)/n)]=[(\rho(m)/m)+(\rho(m+1)/(m+1))] \quad (22)$$

From such a requirement, given a parameter dc(ave) that represents the average number of "1s" in the horizontal direction (row) of the check matrix, as given by Eq. (23) below, the coefficients $\lambda(3)$, $\lambda(n)$, $\rho(m)$, and $\rho(m+1)$ in Eqs. (20) and (21) are determined:

$$dc(ave)=\rho(m)m+\rho(m+1)(m+1) \quad (23)$$

Example analyses will now be shown. Analyses are performed in a case where the order n has four values, that is, n=9, 11, 13, 15, and the order m=6.

Figure 6:
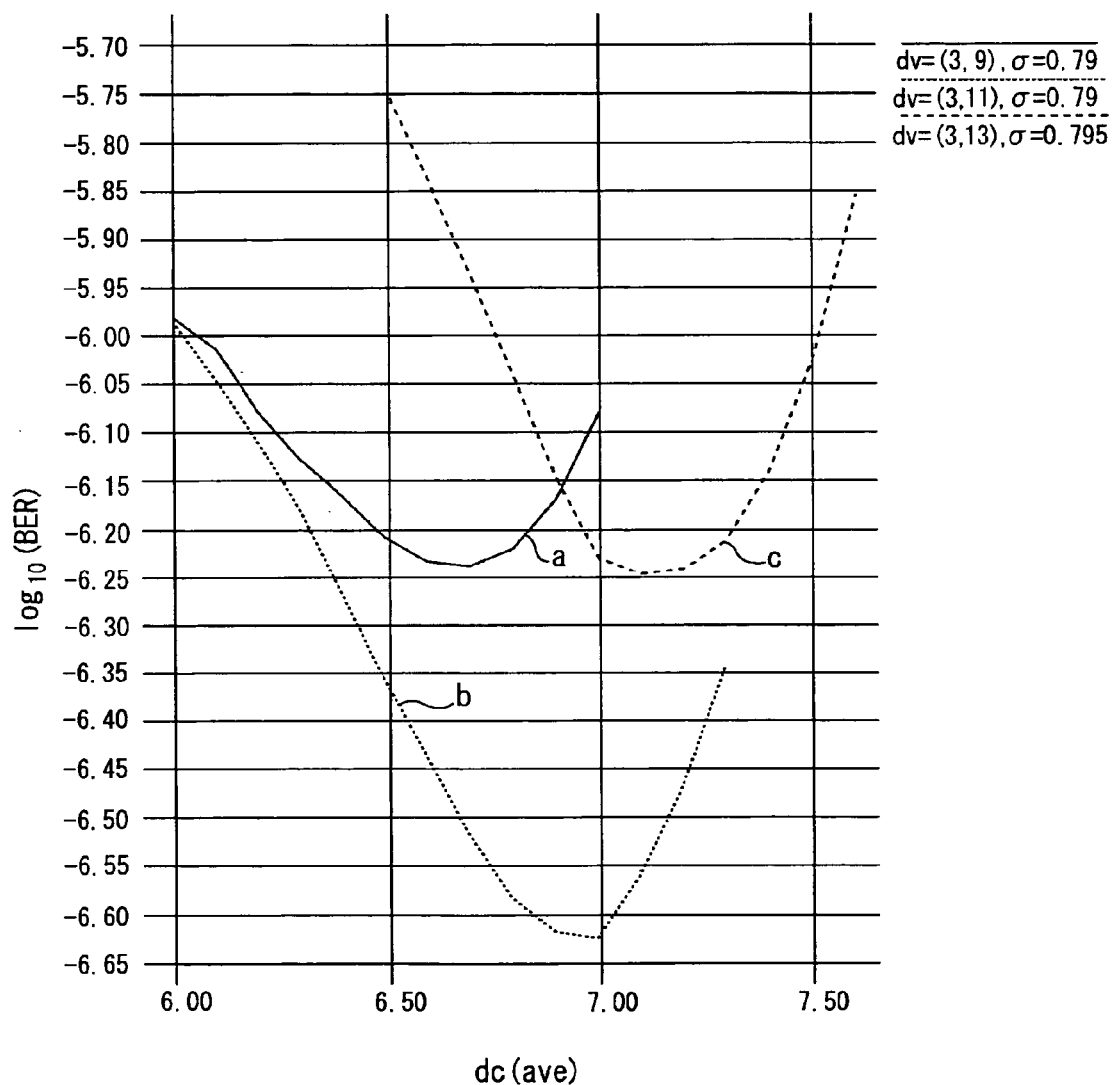
FIG. 6 is a plot of analysis results showing the relationship between the parameter dc(ave) and the base-10 logarithm of the error probability after decoding ($\log_{10}$ BER) when the noise distribution σ is constant in the case of an irregular code.

First, the example where n=9 will be described. In this example, an analysis is performed where the noise distribution σ is 0.79 and the parameter dc(ave) given by Eq. (23) is varied in the range of 6 to 7. The relationship between the parameter dc(ave) and the error probability after decoding exhibits the result indicated by a solid line "a" shown in FIG. 6. In FIG. 6, the x-axis indicates the parameter dc(ave), and the y-axis indicates the base-10 logarithm of the error probability after decoding ($\log_{10}$ BER).

In the case where n=9, the probability distribution $P_v$ given by Eq. (8) has values of 0 through 31. Thus, the probability distribution $P_v$ is quantized to 2 bits using, in place of Eq. (17), V(1) and V(2) each of which is a sum of two terms in the probability distribution $P_v$, as given by Eq. (24) as follows:

$$\begin{cases} V(0) = \sum_{i=0}^{13} P_v(i) \\ V(1) = P_v(14) + P_v(15) \\ V(2) = P_v(16) + P_v(17) \\ V(3) = \sum_{i=18}^{31} P_v(i) \end{cases} \quad (24)$$

It can be seen from FIG. 6 that the error probability after error correction becomes the minimum when the parameter dc(ave) is 6.67.

Figure 7:
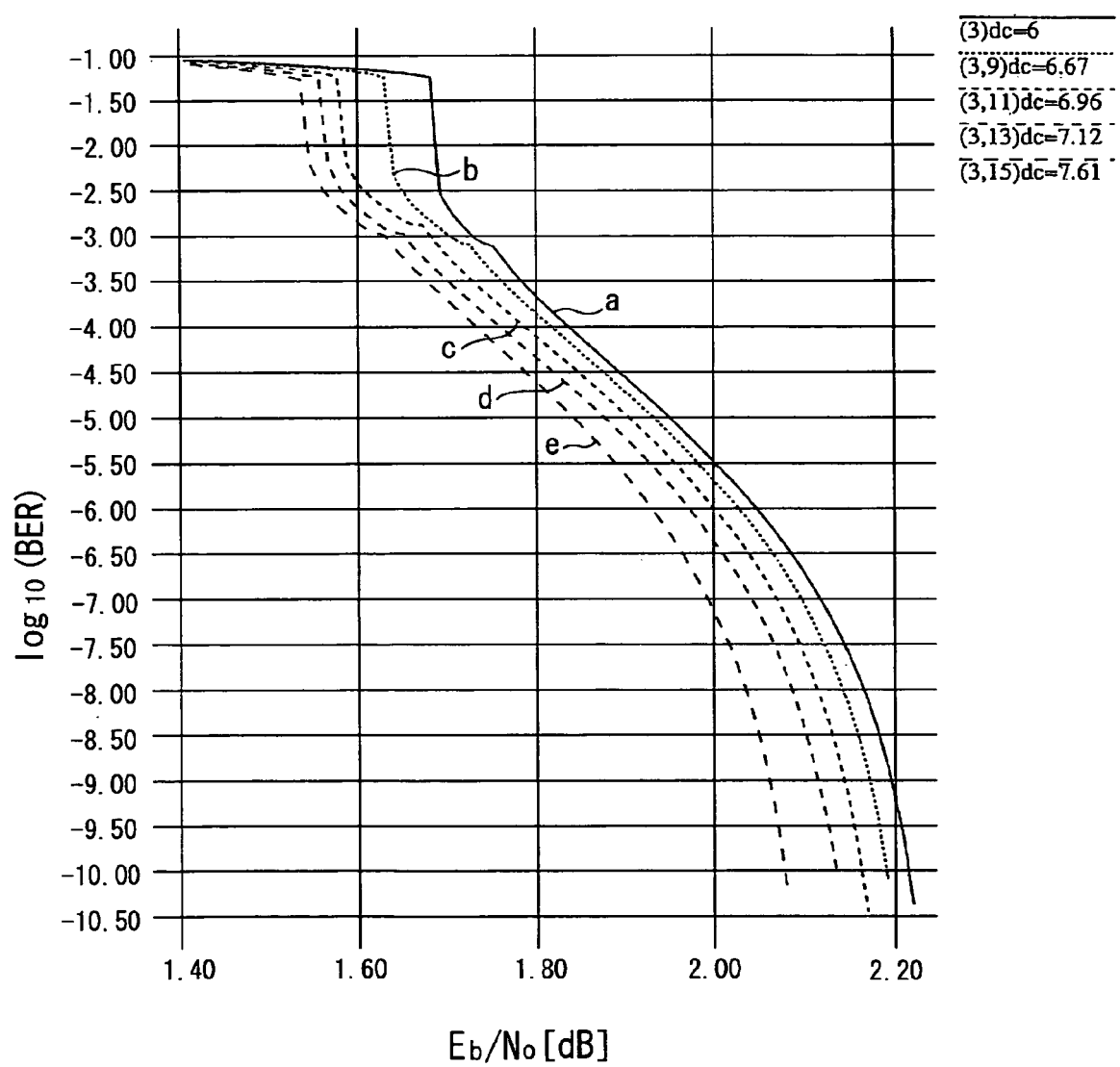
FIG. 7 is a plot of analysis results showing the relationship between the signal-to-noise power ratio $E_b/N_0$ and the base-10 logarithm of the error probability after decoding ($\log_{10}$ BER) when the parameter dc(ave) is constant in the case of an irregular code.

The relationship for the parameter dc(ave) of 6.67 between the signal-to-noise power ratio $E_b/N_0$ and the base-10 logarithm of the error probability after decoding ($\log_{10}$ BER) exhibits the result indicated by a broken line "b" shown in FIG. 7. The noise distribution σ and the error probability $P_b$ before error correction with respect to the signal-to-noise power ratio $E_b/N_0$ on the x-axis shown in FIG. 7 are shown in Table 3 below. In FIG. 7, a solid line "a" indicates the relationship for the parameter dc(ave) of 6, i.e., a regular (3, 6) code.

TABLE 3

| Relationship between $E_b/N_0$, σ, and $P_b$ | | | | | |
|---|---|---|---|---|---|
| $E_b/N_0$ | 1.40 | 1.60 | 1.80 | 2.00 | 2.20 |
| σ | 0.8511 | 0.8318 | 0.8128 | 0.7943 | 0.7763 |
| $P_b$ | 0.12 | 0.1146 | 0.1093 | 0.1040 | 0.0988 |

It can be seen from FIG. 7 that the irregular code with the parameter dc(ave) of 6.67 exhibits a greater improvement in performance than the regular (3, 6) code.

Next, the examples where n=11 and 13 will be described. An analysis for n=11 is performed where the noise distribution σ is 0.79 and an analysis for n=13 is performed where the noise distribution σ is 0.795, while varying the parameter dc(ave). The relationship between the parameter dc(ave) and the error probability after decoding exhibits the result indicated by a broken line "b" shown in FIG. 6 for n=11, and exhibits the result indicated by a broken line "c" shown in FIG. 6 for n=13. The probability distribution $P_v$ is quantized to 2 bits using, as given by Eq. (24), V(1) and V(2) each of which is a sum of two terms in the probability distribution $P_v$.

As can be seen from FIG. 6, the error probability after error correction becomes the minimum when the parameter dc(ave) is 6.96 for n=11, and the error probability after error correction becomes the minimum when the parameter dc(ave) is 7.12 for n=13.

The relationship for the parameter dc(ave) of 6.96 and 7.12 between the signal-to-noise power ratio $E_b/N_0$ and the base-10 logarithm of the error probability after decoding ($\log_{10}$ BER) exhibits the result indicated by broken lines "c" and "d" shown in FIG. 7, respectively.

It can be seen from FIG. 7 that the performance increases as the order n increases.

Figure 8:
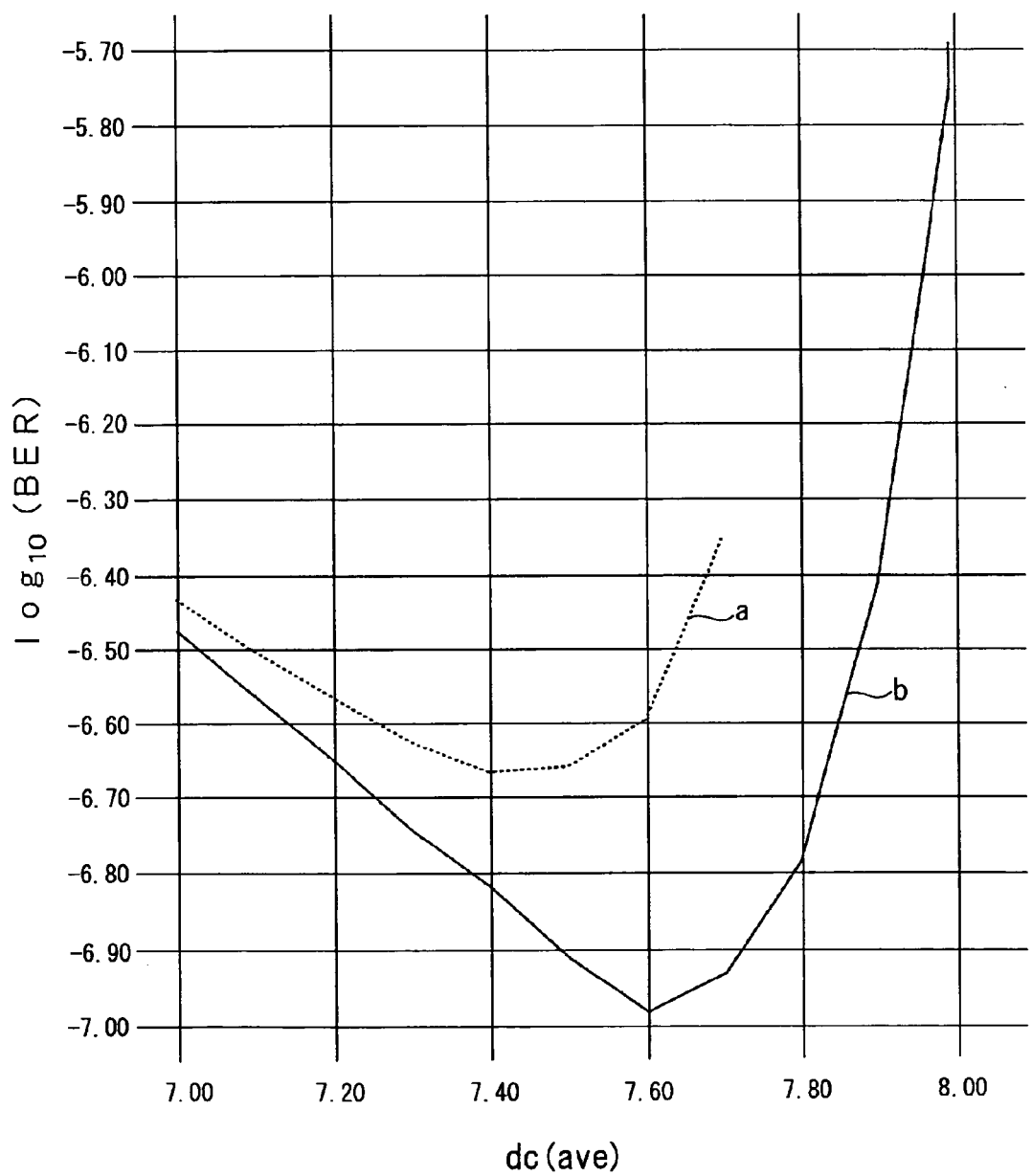
FIG. 8 is a plot of analysis results showing the relationship between the parameter dc(ave) and the base-10 logarithm of the error probability after decoding ($\log_{10}$ BER) when the noise distribution σ is constant in the case of an irregular code, for comparing between the use of a sum of two terms and a sum of three terms in probability distribution $P_v$, as each of V(1) and V(2), for quantization of the probability distribution $P_v$.

Finally, the example where n=15 will be described. In this example, superior performance is determined by comparing between the use of a sum of two terms and a sum of three terms in the probability distribution $P_v$, as each of V(1) and V(2), for quantizing the probability distribution $P_v$ given by Eq. (8). Analyses are performed where the noise distribution σ is 0.795 and the parameter dc(ave) is varied in the range of 7 to 8. As a result of analysis using a sum of two terms, the curve indicated by a broken line "a" shown in FIG. 8 is obtained, and, as a result of analysis using a sum of three terms, the curve indicated by a solid line "b" shown in FIG. 8 is obtained. In FIG. 8, the x-axis indicates the parameter dc(ave), and the y-axis indicates the base-10 logarithm of the error probability after decoding ($\log_{10}$ BER).

As can be seen from FIG. 8, the performance is superior with the use of a sum of three terms in the probability distribution $P_v$, as each of V(1) and V(2), and the error probability after error correction becomes the minimum when the parameter dc(ave) is 7.61.

The relationship between the signal-to-noise power ratio $E_b/N_0$ and the base-10 logarithm of the error probability after decoding ($\log_{10}$ BER), where the parameter dc(ave) is 7.61 and a sum of three terms in the probability distribution $P_v$ is used as each of V(1) and V(2), exhibits the result indicated by a broken line "e" shown in FIG. 7.

It can be seen from FIG. 7 that the performance increases as the order n increases.

As a result of such analyses, irregular codes exhibit a greater improvement in performance than regular codes, and, in irregular codes, the performance increases as the highest order n of the function $\lambda(x)$ representing the degree sequence increases.

An observation is made on the characteristics exhibited when the highest order n of the function $\lambda(x)$ still increases. The characteristics are compared between when the function $\lambda(x)$ is expressed by a polynomial that is a sum of two terms and a polynomial that is a sum of three terms.

First, the example where the function $\lambda(x)$ is expressed by a polynomial that is a sum of two terms, i.e., where the degree sequence in the vertical direction (column) of the check matrix is expressed by Eq. (20), will be described. In this example, the degree sequence in the horizontal direction (row) of the check matrix is expressed by the function $\rho(x)$ given by Eq. (21).

In density evolution, when the function $\lambda(x)$ is expressed by Eq. (20), the probability distribution for the $x_3$ term is determined by Eqs. (8) and (17). In density evolution, on the other hand, the $x_n$ term may be subjected to convolutional computation using the fast Fourier transform (hereinafter referred to as FFT). The value as a result of the convolutional computation has $P_v(0)$ to $P_v(nf)$ (nf=7+3(n−1)). For analysis, this result is quantized to 2 bits. When the order n is large, the quantization to 2 bits using V(1) and V(2) in Eq. (17), each of which is not expressed by a single term but two or more terms, provides a greater improvement in performance. An observation is made on the performance while varying the number of terms k for V(1) and V(2) during quantization.

In this analysis, the quantization widths $a_1$, $a_2$, and $a_3$ for quantization of the initial message $U_0$ to 3 bits are always optimized, and the noise distribution σ with respect to error probability given by iterative decoding is determined. More specifically, in this analysis, given an order n of the function $\lambda(x)$, the coefficient $\lambda(n)$ given in Eq. (20) is optimized so that the noise distribution σ becomes the maximum for the error probability after iterative decoding of $10^{-3}$ and $10^{-6}$.

Figure 9:
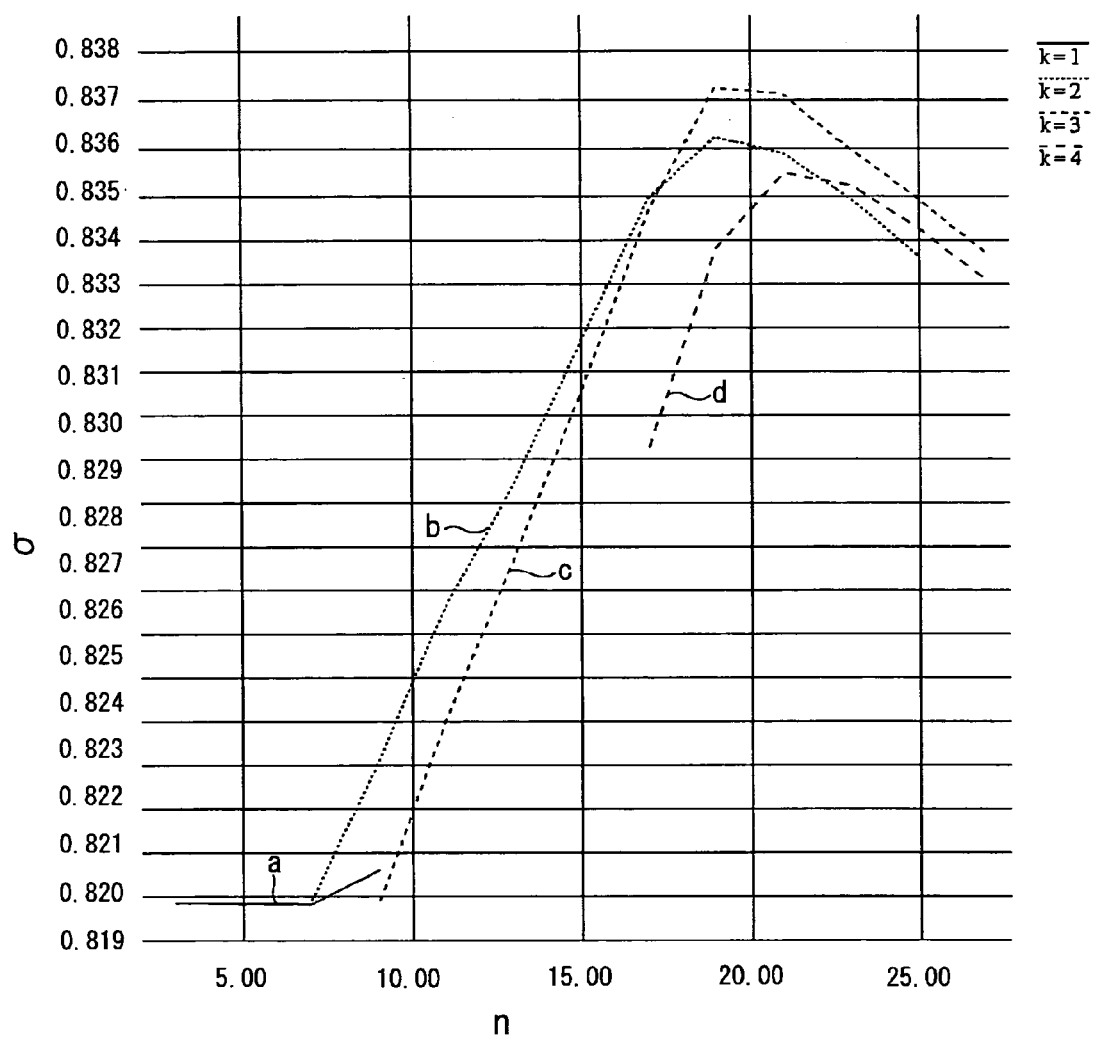
FIG. 9 is a plot of analysis results showing the relationship between the order n of function λ(x) and the noise distribution σ for the error probability after decoding of $10_{-3}$.

The relationship between the order n and the noise distribution σ for the error probability after decoding of $10_{-3}$ exhibits the results shown in FIG. 9. In FIG. 9, the number of terms k for V(1) and V(2) during quantization of the probability distribution $P_v$ to 2 bits is used as a parameter, and the characteristics for k=1, 2, 3, and 4 are indicated by a solid line "a" and broken lines "b", "c", and "d", respectively.

It can be seen from FIG. 9 that the performance exhibits the greatest improvement for k=3. More specifically, for k=3, the noise distribution σ increases as the order n increases up to n=19, and the error correction performance is improved. When the order n is over 19, the noise distribution σ decreases, and the error correction performance deteriorates. The result of this analysis shows that, for the error probability after error correction of $10^{-3}$, the error correction performance becomes the best when the number of terms k is 3 and when the order n is 19, and the maximum noise distribution σ at this time is 0.8371 ($E_b/N_0$=1.54 dB). The coefficient $\lambda(n)$ is 0.3088, and the average ρ(ave) of the number of "1s" in the horizontal direction (row) of the check matrix is 8.1270.

Figure 10:
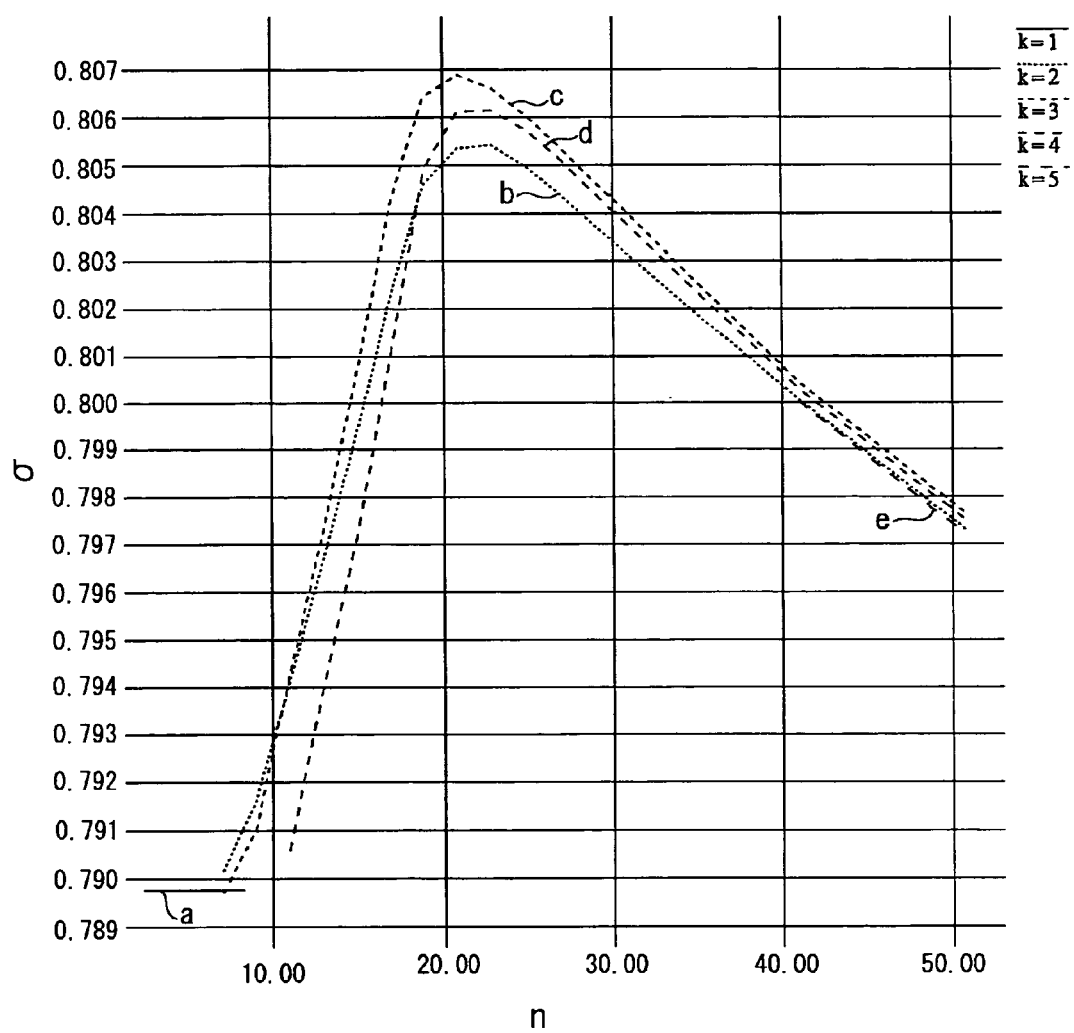
FIG. 10 is a plot of analysis results showing the relationship between the order n of function λ(x) and the noise distribution σ for the error probability after decoding of $10_{-6}$.

The relationship between the order n and the noise distribution σ for the error probability after decoding of $10_{-6}$ exhibits the results shown in FIG. 10. Also in FIG. 10, the number of terms k for V(1) and V(2) during quantization of the probability distribution $P_v$ to 2 bits is used as a parameter, and the characteristics for k=1, 2, 3, 4, and 5 are indicated by a solid line "a" and broken lines "b", "c", "d", and "e", respectively.

As can be seen from FIG. 10, when the order n is larger than 11, the performance exhibits the greatest improvement for k=3. More specifically, for k=3, the noise distribution σ increases as the order n increases up to n=21, and the error correction performance is improved. When the order n is over 21, the noise distribution σ decreases, and the error correction performance deteriorates. The result of this analysis shows that, for the error probability after error correction of $10_{-6}$, the error correction performance becomes the best when the number of terms k is 3 and when the order n is 21, and the maximum noise distribution σ at this time is 0.8068 ($E_b/N_0$=1.864 dB). The coefficient $\lambda(n)$ is 0.3010, and the average ρ(ave) of the number of "1s" in the horizontal direction (row) of the check matrix is 8.096.

Accordingly, when the function $\lambda(x)$ is expressed by a polynomial that is a sum of two terms, the order n has a threshold that provides the best error correction performance.

Next, the example where the function $\lambda(x)$ is expressed by a polynomial that is a sum of three terms, i.e., where the degree sequence in the vertical direction (column) of the check matrix is expressed by Eq. (25) below, will be described. In this example, the degree sequence in the horizontal direction (row) of the check matrix is expressed by the function $\rho(x)$ given by Eq. (21). In Eq. (25) below, each of the orders $n_1$ and $n_2$ is an odd number.

$$\lambda(x)=\lambda(3)x^3+\lambda(n_1)x^{n_1}+\lambda(n_2)x_n^2$$

where $\lambda(3)+\lambda(n_1)+\lambda(n_2)=1$ \hfill (25)

When the code rate is ½, the requirement given by Eq. (26) is added as follows:

$$\frac{1}{2}[(\lambda(3)/3)+(\lambda(n_1)/n_1)+(\lambda(n_2)/n_2)]=[(\rho(m)/m)+(\rho(m+1)/(m+1))] \hfill (26)$$

Given coefficients $\lambda(n_1)$ and $\lambda(n_2)$ in Eq. (26), the order m of the function $\rho(x)$ may be determined as an integer m that satisfies 0<ρ(m)<1.

In the analysis, in the function $\lambda(x)$ given by Eq. (25), as described above, the probability distribution for the $x^3$ term is determined by Eqs. (8) and (17), and the $x^{n1\ and\ xn2}$ terms are subjected to convolutional computation using FFT. This result is quantized to 2 bits using V(1) and V(2) in Eq. (17), each of which meets the condition where the best performance is exhibited when the function $\lambda(x)$ is expressed by a polynomial that is a sum of two terms, i.e., each of which has three terms (k=3) when the orders $n_1$ and $n_2$ are 11 or more.

In this analysis, given orders $n_1$ and $n_2$ of the function $\lambda(x)$, the coefficients $\lambda(n_1)$ and $\lambda(n_2)$ in Eq. (25) are optimized so that the noise distribution $\sigma$ becomes the maximum for the error probability after iterative decoding of $10^{-6}$.

Figure 11:
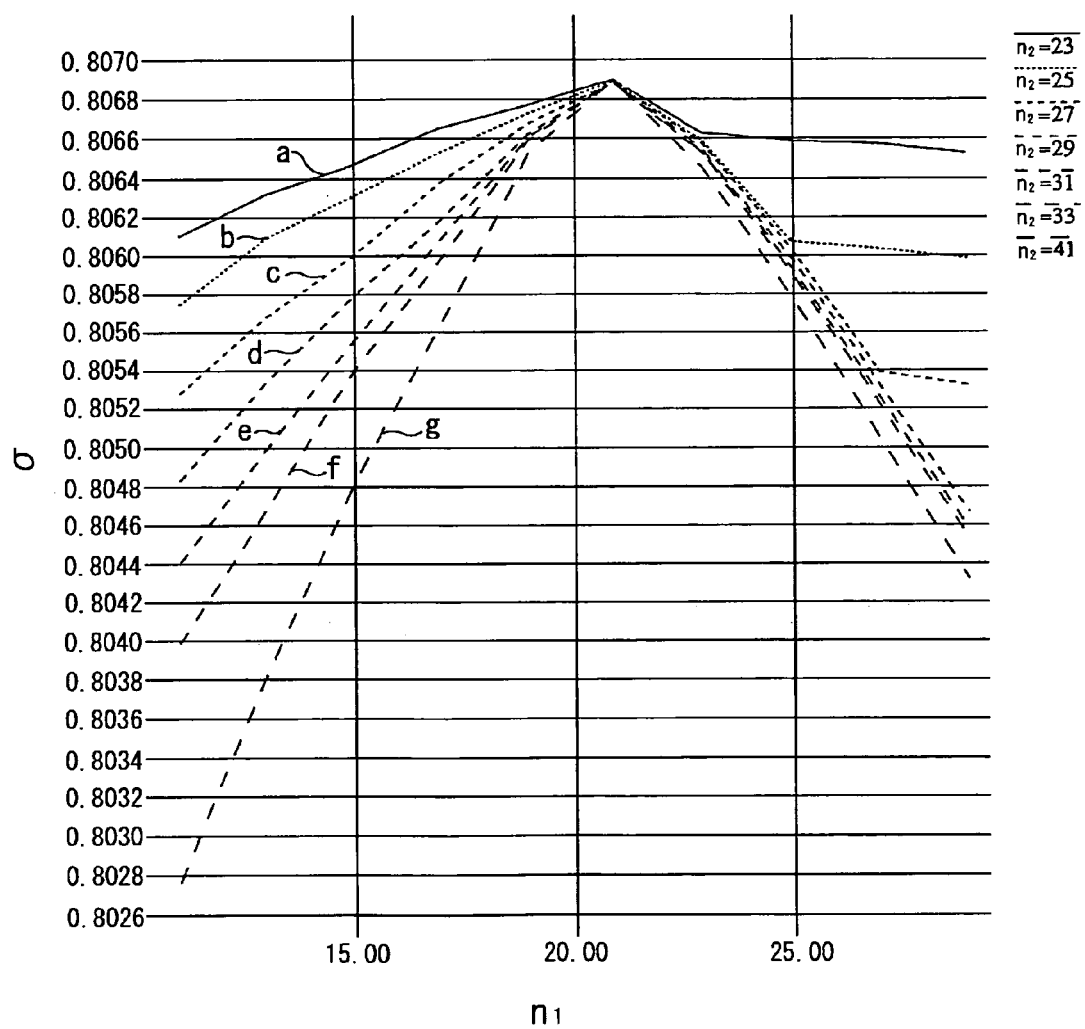
FIG. 11 is a plot of analysis results showing the relationship between the order $n_1$ and the noise distribution σ for the error probability after decoding of $10_{-6}$, where the order $n_2$ of function λ(x) is used as a parameter.

The relationship between the order $n_1$ and the noise distribution $\sigma$ for the error probability after decoding of $10_{-6}$, where the order $n_2$ is used as a parameter, exhibits the results shown in FIG. 11. In FIG. 11, the characteristics for $n_2$=23, 25, 27, 29, 31, 33, and 41 are indicated by a solid line "a" and broken lines "b", "c", "d", "e", "f", and "g", respectively.

It can be seen from FIG. 11 that the performance exhibits the greatest improvement when $n_1$=21. In addition, when $n_1$=21, the noise distribution $\sigma$ is constant irrespective of the value of the order $n_2$. More specifically, the noise distribution $\sigma$ increases as the order $n_1$ increases up to $n_1$=21, and the error correction performance is improved. When the order $n_1$ is over 21, the noise distribution $\sigma$ decreases, and the error correction performance deteriorates. The result of this analysis shows that, for the error probability after error correction of $10_{-6}$, the error correction performance becomes the best when the number of terms k is 3 and when the order $n_1$ is 21, and the maximum noise distribution $\sigma$ at this time is 0.8068 ($E_b/N_0$=1.864 dB). The coefficient $\lambda(n_2)$ is 0, and this result matches the result shown in FIG. 10 for $n_1$=21 when the function $\lambda(x)$ is expressed by a polynomial that is a sum of two terms.

Although not shown, the relationship for $n_2$=21 between the order $n_1$ and the noise distribution $\sigma$ for the error probability after decoding of $10_{-6}$ exhibits that the noise distribution $\sigma$ increases for a negative coefficient $\lambda(n_1)$, while the noise distribution $\sigma$ decreases for a positive coefficient $\lambda(n_1)$. Thus, the best performance is exhibited when the coefficient $\lambda(n_1)$ is 0. This corresponds to the result shown in FIG. 10 in which the function $\lambda(x)$ is expressed by a polynomial that is a sum of two terms.

Therefore, the functions $\lambda(x)$ and $\rho(x)$ that provide the maximum noise distribution $\sigma$ for the error probability after error correction of $10_{-6}$ are given by Eqs. (27) and (28), respectively, as follows:

$$\lambda(x) = 0.6990x^3 + 0.3010x^{21} \quad (27)$$

$$\rho(x) = 0.9040x^8 + 0.0960x^9 \quad (28)$$

The quantization widths $a_1$, $a_2$, and $a_3$ for quantization of the initial message $U_0$ to 3 bits are 1.609, 5.542, and 24.124, respectively.

Accordingly, also when the function $\lambda(x)$ is expressed by a polynomial that is a sum of three terms, the order $n_1$ has a threshold that provides the best error correction performance. Moreover, even when the function $\lambda(x)$ is expressed by a polynomial that is a sum of three terms, the noise distribution $\sigma$ is not larger than the maximum noise distribution $\sigma$ when the function $\lambda(x)$ is expressed by a polynomial that is a sum of two terms. Thus, it is sufficient to express the function $\lambda(x)$ by a polynomial that is a sum of two terms.

From the analysis results described above, in irregular LDPC codes, there is an optimum degree sequence and an optimum quantization width for decoding depending upon the value of the noise distribution $\sigma$. In LDPC codes, therefore, preferably, the degree sequence and the quantization width are set so that the error probability after decoding becomes the minimum with respect to a given noise distribution $\sigma$. In other words, in LDPC codes, preferably, the degree sequence and the quantization width are set so that the noise distribution $\sigma$ becomes the maximum with respect to a given error probability after decoding.

More specifically, the function $\lambda(x)$ representing the degree sequence in the vertical direction (column) of the check matrix is optimized with respect to a given noise distribution $\sigma$ or a given error probability after decoding by fixing the order $m_i$ of the function $\rho(x)$ representing the degree sequence in the horizontal direction (row) of the check matrix. The quantization widths $a_1$, $a_2$, and $a_3$ for quantization of the initial message are also optimized.

The function $\rho(x)$ may be expressed by a polynomial that is a sum of two terms whose orders are adjacent integers m and m+1, as give by Eq. (21). The average $\rho$(ave) of the number of "1s" in the horizontal direction (row) of the check matrix, the quantization widths $a_1$, $a_2$, and $a_3$, and the function $\lambda(x)$ are optimized with respect to a given noise distribution $\sigma$ or a given error probability after decoding.

Most preferably, each of the functions $\lambda(x)$ and $\rho(x)$ is expressed by a polynomial that is a sum of two terms, as given by Eqs. (20) and (21), respectively.

In view of such analysis results, the encoding device 1 of the transmitting apparatus in the data transmission and reception system may be configured in the manner described below.

Figure 12:
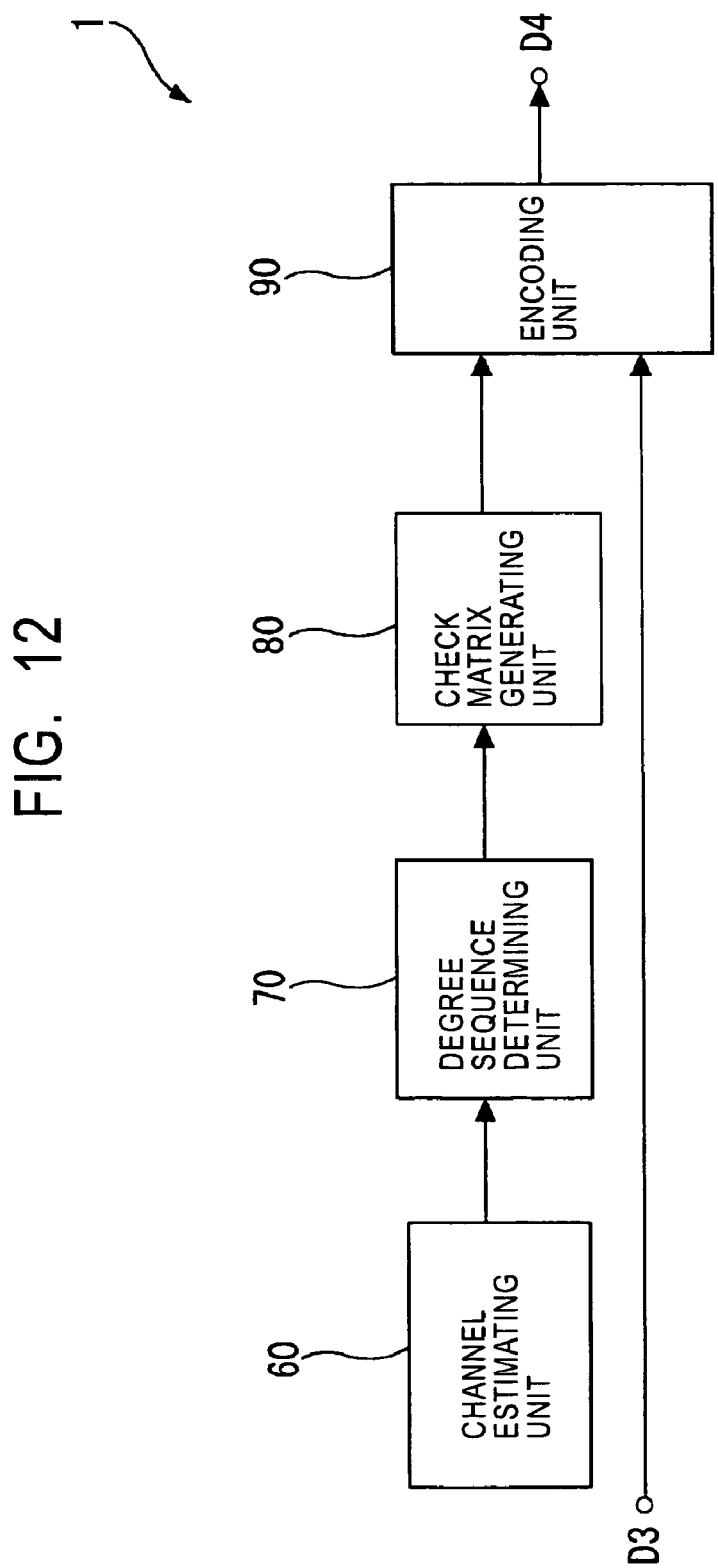
FIG. 12 is a block diagram showing the structure of an encoding device in the data transmission and reception system.

For example, as shown in FIG. 12, the encoding device 1 includes a channel estimating unit 60 that estimates the state of a communication channel, a degree sequence determining unit 70 that determines the degree sequence that is optimized based on the noise distribution $\sigma$ estimated by the channel estimating unit 60, a check matrix generating unit 80 that generates a check matrix based on the degree sequence determined by the degree sequence determining unit 70, and an encoding unit 90 that performs coding of LDPC codes using the check matrix generated by the check matrix generating unit 80.

The channel estimating unit 60 estimates the state of a communication channel to determine a noise distribution $\sigma$. The channel estimating unit 60 supplies information indicating the value of the determined noise distribution $\sigma$ to the degree sequence determining unit 70.

The degree sequence determining unit 70 determines the optimum degree sequence based on the noise distribution $\sigma$ determined by the channel estimating unit 60. That is, the degree sequence determining unit 70 determines the degree sequence so that the error probability after decoding becomes the minimum with respect to the noise distribution $\sigma$ determined by the channel estimating unit 60. Alternatively, the degree sequence determining unit 70 may determine the degree sequence so that the noise distribution $\sigma$ becomes the maximum with respect to a given error probability after decoding. More specifically, the degree sequence determining unit 70 fixes the order m of the function $\rho(x)$, and determines the function $\lambda(x)$ that is optimized with respect to a given noise distribution $\sigma$ or a given error probability after decoding. Furthermore, the degree sequence determining unit 70 determines the function $\rho(x)$ expressed by a polynomial that is a sum of two terms whose orders are adjacent integers, and also determines the function $\lambda(x)$ that is optimized with respect to a given noise distribution $\sigma$ or a given error probability after decoding, and the average $\rho$(ave) of the number of "1s" in the horizontal direction (row) of the check matrix. More preferably, the degree sequence determining unit 70 determines the optimum functions λ(x) and ρ(x), each of which is expressed by a polynomial that is a sum of two terms, as given by Eqs. (20) and (21), respectively. The degree sequence determining unit 70 supplies information indicating the determined degree sequence to the check matrix generating unit 80.

The check matrix generating unit 80 generates a check matrix based on the degree sequence determined by the degree sequence determining unit 70. The check matrix generating unit 80 supplies the generated check matrix to the encoding unit 90.

The encoding unit 90 performs coding of LDPC codes using the check matrix generated by the check matrix generating unit 80. More specifically, the encoding unit 90 generates a generator matrix based on the check matrix, and multiplies the generator matrix by input data D3 input as information bits, thereby generating encoded data D4 as code bits. The encoding unit 90 outputs the generated encoded data D4 to a modulator (not shown).

In this manner, the encoding device 1 encodes the input data D3 using the check matrix based on the degree sequence optimized based on the noise distribution σ. The encoded data D4 encoded by the encoding device 1 is mapped by the modulator (not shown) so that a code bit of value "0" is converted into "+1" and a code bit of value "1" is converted into "−1" for transmission. The transmitted data is received by the receiving apparatus via the predetermined communication channel 2.

The decoding device 3 shown in FIG. 4 may be employed. In the data transmission and reception system, the encoding device 1 that is capable of determining the quantization widths $a_1$, $a_2$, and $a_3$ optimized based on the noise distribution σ may transmit information indicating the values of the determined quantization widths $a_1$, $a_2$, and $a_3$ to the decoding device 3. This decoding device 3 does not require the distribution determining unit 20 and quantization width determining unit 30 shown in FIG. 4, thus reducing the circuit size and achieving simple processing.

As described above, the encoding device 1 in the data transmission and reception system according to an embodiment of the present invention is capable of determining the degree sequence that is optimized so that the error probability after decoding becomes the minimum with respect to the noise distribution σ or the noise distribution σ becomes the maximum with respect to a given error probability after decoding when the decoding device 3 expresses a received value or a message exchanged between nodes with a low bit number, thus allowing for improvement in error correction performance.

In expressing a received value or a message exchanged between nodes with a low bit number, the decoding device 3 is capable of optimizing the quantization width so that the error probability after decoding becomes the minimum with respect to the noise distribution σ or the noise distribution σ becomes the maximum with respect to a given error probability after decoding, thus allowing for high-precision decoding of LDPC codes.

Therefore, the data transmission and reception system contributes to a significant improvement in code performance, and provides better convenience or reliability for a user.

The present invention is not limited to the foregoing embodiment. In the foregoing embodiment, the encoding device and the decoding device are used in a transmitting apparatus and a receiving apparatus in a data transmission and reception system, by way of example. However, the present invention is applicable to, for example, a recording and/or playback device for recording onto and/or playback on a recording medium, such as a magnetic, optical, or magneto-optical disk, for example, a floppy (registered trademark) disk, a CD-ROM, or an MO (Magneto Optic) disk. In this case, the data encoded by the encoding device is recorded onto a recording medium equivalent to a communication channel, and is decoded by the decoding device for playback.

In the foregoing embodiment, the encoding device and the decoding device are configured by hardware; however, the encoding device and the decoding device may be implemented by software executable on, for example, a computer apparatus such as a workstation or a personal computer. This example will now be described with reference to FIG. 13.

Figure 13:
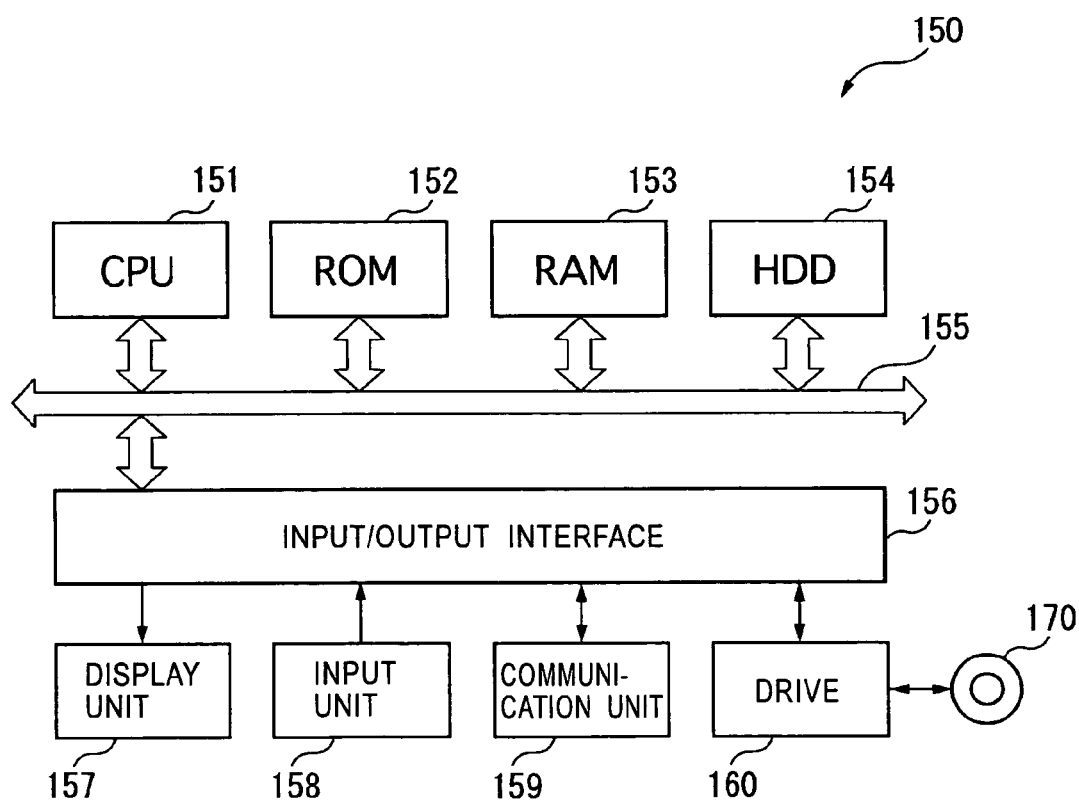
FIG. 13 is a block diagram showing the structure of a computer apparatus.
Figure 14:
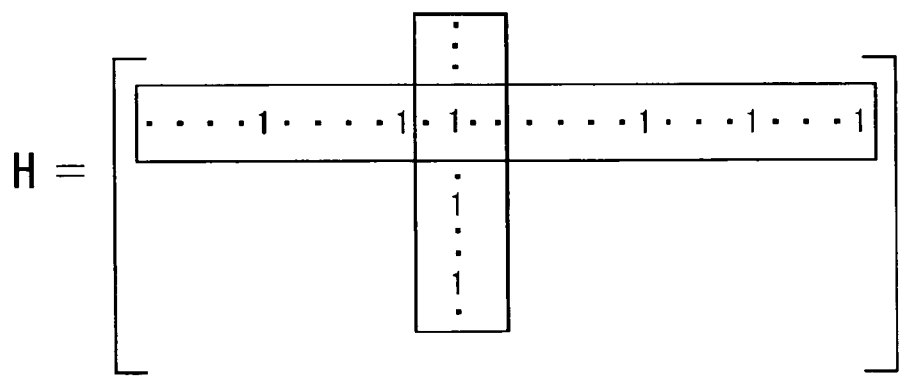
FIG. 14 is an illustration showing an example sparse check matrix.
Figure 15:
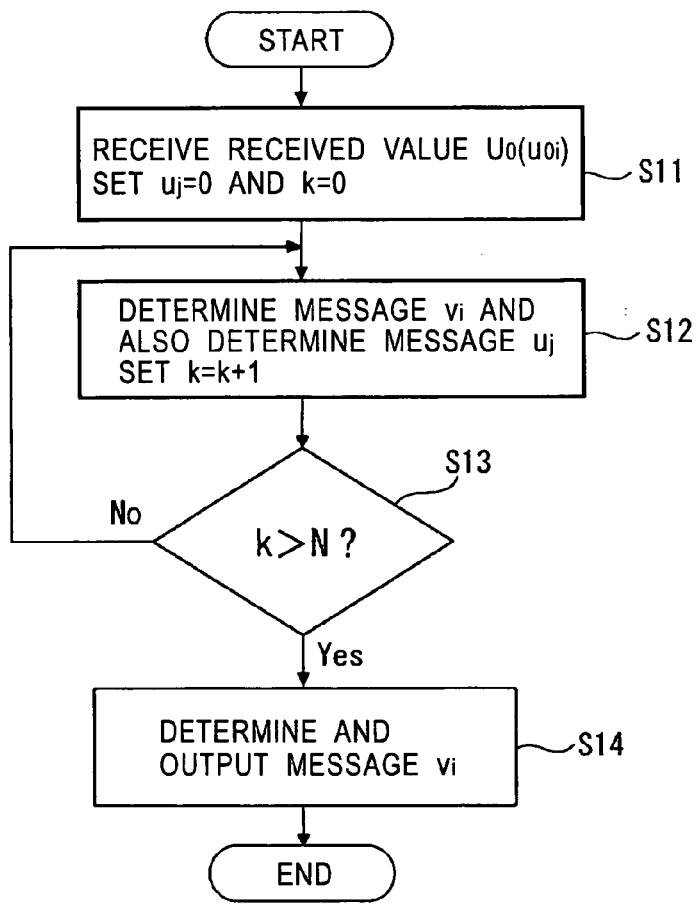
FIG. 15 is a flowchart showing a series of steps for decoding of LDPC codes.
Figure 16:
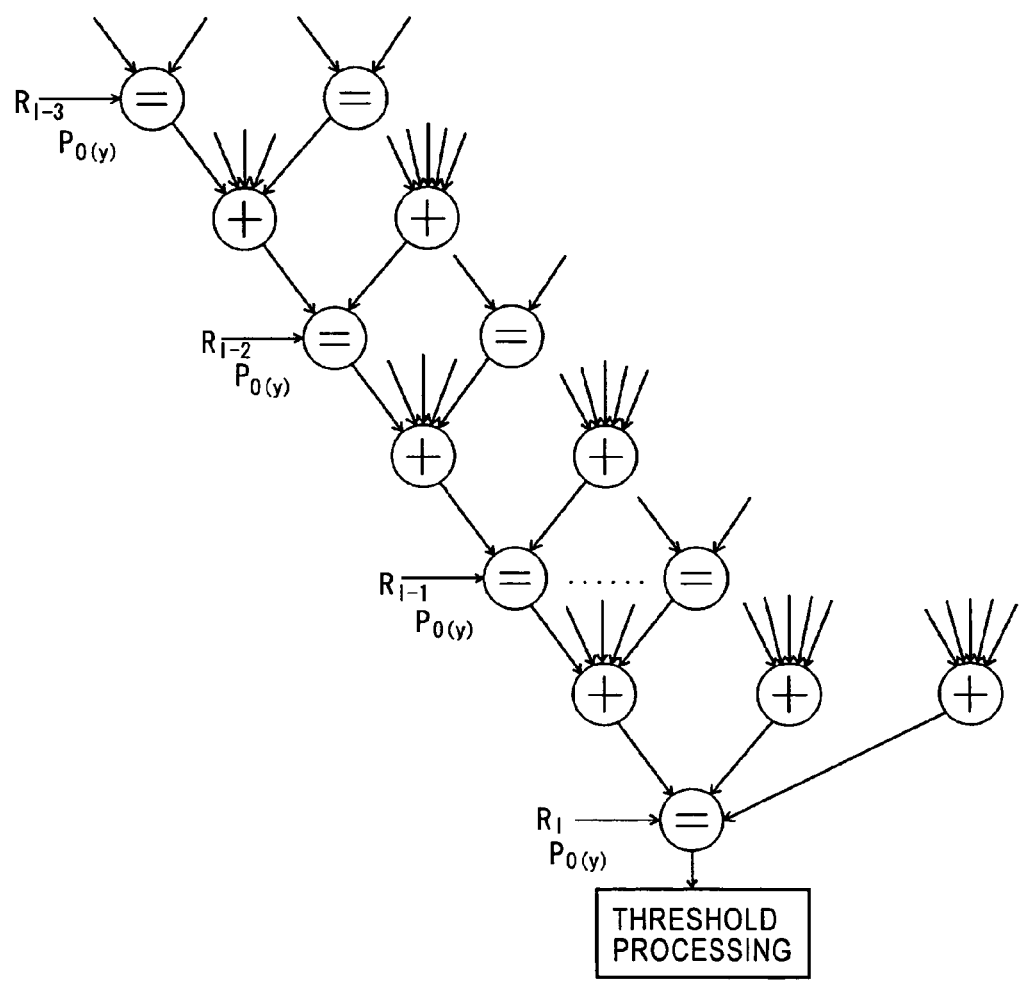
FIG. 16 is a diagram showing a message flow between nodes when a (3, 6) code is decoded.
Figure 17:
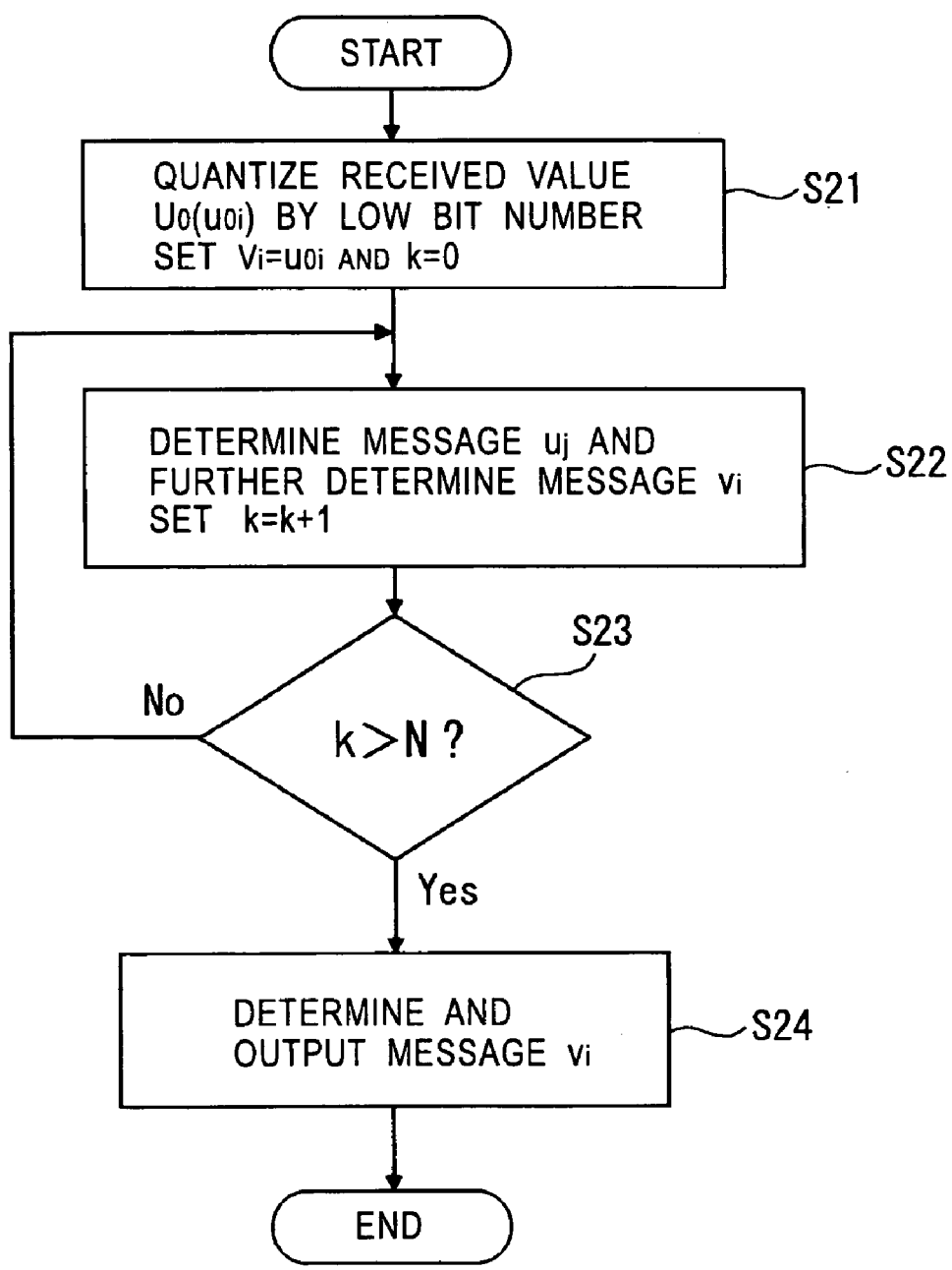
FIG. 17 is a flowchart showing a series of steps for decoding of LDPC codes by quantization with a low bit number.

As shown in FIG. 13, a computer apparatus 150 includes a CPU (Central Processing Unit) 151 that collectively controls components, a read only memory or ROM 152 that stores information including various programs, a RAM (Random Access Memory) 153 serving as a work area, an HDD (Hard Disk Drive) 154 for recording and/or playback various programs, data, and so on, a bus 155 for connecting the CPU 151, the ROM 152, the RAM 153, and the HDD 154, an input/output interface 156 for inputting and outputting data between the CPU 151, the ROM 152, the RAM 153, and the HDD 154, and a display unit 157, an input unit 158, a communication unit 159, and a drive 160, described below, the display unit 157 that displays various information, the input unit 158 that receives an operation from a user, the communication unit 159 for communication with an external device, and the drive 160 for recording and/or playing back various information on a removable recording medium 170.

The CPU 151 is connected with the ROM 152, the RAM 153, and the HDD 154 via the bus 155, and controls the ROM 152, the RAM 153, and the HDD 154. The CPU 151 is also connected with the input/output interface 156 via the bus 155, and controls the display unit 157, the input unit 158, the communication unit 159, and the drive 160, which are connected with the input/output interface 156. The CPU 151 also executes various programs recorded in the ROM 152, the HDD 154, and the recording medium 170 installed in the drive 160.

The ROM 152 stores information including various programs. The information stored in the ROM 152 is read under the control of the CPU 151.

The RAM 153 serves as a work area for which the CPU 151 executes various programs, and temporarily stores various data under the control of the CPU 151.

The HDD 154 records and/or plays back various program, data, and so on on the hard disk under the control of the CPU 151.

The bus 155 carries various data, etc., that is read from the ROM 152, the RAM 153, and the HDD 154, and also carries various data, etc., that is to be recorded onto the RAM 153 and the HDD 154 under the control of the CPU 151.

The input/output interface 156 includes an interface for displaying various information on the display unit 157 under the control of the CPU 151, an interface for transmitting a control signal indicating the content operated by a user using the input unit 158 to the CPU 151, an interface for inputting and outputting data to and from an external device via the communication unit 159 under the control of the CPU 151, and an interface for recording and/or playing back various information on the recording medium 170 installed in the drive 160. The input/output interface 156 allows the data from the CPU 151, the ROM 152, the RAM 153, and the HDD 154 to be output to the display unit 157, the communication unit 159, and the drive 160, and also allows the data from the input unit 158, the communication unit 159, and the drive 160 to be input to the CPU 151, the ROM 152, the RAM 153, and the HDD 154.

The display unit 157 is, for example, an LCD (Liquid Crystal Display), and displays various information, such as the data recorded in, for example, the HDD 154, under the control of the CPU 151.

The input unit 158 receives a user operation using, for example, a keyboard or a mouse, and outputs a control signal indicating the content of the operation to the CPU 151.

The communication unit 159 serves as an interface for communication with an external device over, for example, a network connection, a satellite connection, or the like under the control of the CPU 151.

The drive 160 has the recording medium 170 removably installed therein, such as a magnetic, optical, or magneto-optical disk, for example, a floppy (registered trademark) disk, a CD-ROM, or an MO disk, and records and/or plays back various information on the installed recording medium 170 under the control of the CPU 151.

By executing a predetermined program by the CPU 151 executes, the computer apparatus 150 allows for encoding processing in the encoding device 1 and/or decoding processing in the decoding device 3 described above.

The encoding processing in the computer apparatus 150 will first be described.

For example, when a user performs a predetermined operation for executing a coding program, the computer apparatus 150 supplies a control signal indicating the operation to the CPU 151 via the input unit 158. In response, the CPU 151 loads the coding program onto the RAM 153 to execute, and the computer apparatus 150 outputs the coded and modulated data to an external device via the communication unit 159, while displaying a processing result or the like on the display unit 157, if necessary.

The coding program is provided by, for example, the recording medium 170, and may be directly read from the recording medium 170 under the control of the CPU 151 or may be read from a hard disk onto which the program has once been recorded. The coding program may be stored in advance in the ROM 152. The data to be encoded is recorded in the hard disk. This data corresponds to the input data D3 described above.

More specifically, when the coding program is executed by the CPU 151, the computer apparatus 150 estimates the state of a communication channel to determine a noise distribution σ under the control of the CPU 151.

Then, the computer apparatus 150 determines the optimum degree sequence based on the determined noise distribution σ under the control of the CPU 151.

Then, the computer apparatus 150 generates a check matrix based on the determined degree sequence under the control of the CPU 151.

Then, the computer apparatus 150 reads desired data recorded in the hard disk under the control of the CPU 151, and multiplies a generator matrix based on the check matrix by the read data to perform coding of LDPC codes, thereby generating encoded data corresponding to the encoded data D4 described above.

Then, the computer apparatus 150 maps the generated encoded data to a predetermined transmission symbol under the control of the CPU 151, and records the generated transmission symbol onto a hard disk or the like. Then, the computer apparatus 150 reads the once recorded transmission symbol at a predetermined timing, and outputs the symbol to an external device via the communication unit 159, while displaying a processing result or the like on the display unit 157, if necessary. The generated transmission symbol may be recorded in the recording medium 170 or the like.

Accordingly, the computer apparatus 150 implements encoding processing in the encoding device 1 described above by executing a coding program.

Next, the decoding processing in the computer apparatus 150 will be described.

For example, when a user performs a predetermined operation for executing a decoding program, the computer apparatus 150 supplies a control signal indicating the operation to the CPU 151 via the input unit 158. In response, the CPU 151 loads the decoding program onto the RAM 153 to execute, and the computer apparatus 150 receives data from an external device via the communication unit 159. The computer apparatus 150 decodes the received value of this data, and displays a processing result or the like on the display unit 157, if necessary.

Like the coding program, the decoding program is also provided by, for example, the recording medium 170, and may be directly read from the recording medium 170 under the control of the CPU 151 or may be read from a hard disk on which the program has once been recorded. The decoding program may be stored in advance in the ROM 152.

More specifically, when the decoding program is executed by the CPU 151, the computer apparatus 150 determines a noise distribution σ from the received value read from the hard disk or the received value received via the communication unit 159 under the control of the CPU 151.

Then, the computer apparatus 150 determines the optimum quantization width based on the determined noise distribution σ, and quantizes the probability distribution of the received value according to the determined quantization width.

Then, the computer apparatus 150 performs iterative decoding on the quantized probability distribution of the received value a predetermined number of times, for example, several times to tens of times, under the control of the CPU 151, and outputs the decoded data, corresponding to the decoded data D2 described above, as a result of decoding the predetermined number of times. The computer apparatus 150 also quantizes the probability distribution of the message output from a variable node under the control of the CPU 151 according to the quantization width optimized based on the determined noise distribution σ.

The computer apparatus 150 records the resulting decoded data onto a hard disk or the like under the control of the CPU 151, and displays a processing result or the like on the display unit 157, if necessary. The resulting decoded data may be recorded in the recording medium 170 or the like.

Accordingly, the computer apparatus 150 implements decoding processing in the decoding device 3 described above by executing a decoding program.

As described above, it is to be understood that various modifications may be made to the present invention, as desired, without departing from the spirit and scope of the invention.

As described above in detail, a decoding device according to the present invention is a decoding device that decodes a code encoded by low-density parity check coding, including receiving means for receiving data as a received value, distribution determining means for determining a distribution of noise that is superposed on the data received by the receiving means, quantization width determining means for determining a quantization width that is optimized so that an error probability after decoding becomes the minimum with respect to the noise distribution determined by the distribution determining means or the noise distribution determined by the distribution determining means becomes the maximum with respect to a given error probability after decoding, quantizing means for quantizing a probability distribution of the received value received by the receiving means with a predetermined low bit number according to the quantization width determined by the quantization width determining means, and message determining means for determining a message as information bits based on the probability distribution of the received value quantized by the quantizing means.

In the decoding device according to the present invention, therefore, the probability distribution of the received value is quantized by the quantizing means with a predetermined low bit number according to the quantization width that is optimized so that the error probability after decoding becomes the minimum with respect to a given noise distribution or the noise distribution becomes the maximum with respect to a given error probability after decoding, and decoding is performed by the message determining means based on the probability distribution of the received value quantized by the quantizing means. This achieves a significant improvement in code performance, and allows for high-precision decoding.

A decoding method according to the present invention is a decoding method for decoding a code encoded by low-density parity check coding, including a receiving step of receiving data as a received value, a distribution determining step of determining a distribution of noise that is superposed on the data received in the receiving step, a quantization width determining step of determining a quantization width that is optimized so that an error probability after decoding becomes the minimum with respect to the noise distribution determined in the distribution determining step or the noise distribution determined in the distribution determining step becomes the maximum with respect to a given error probability after decoding, a quantizing step of quantizing a probability distribution of the received value received in the receiving step with a predetermined low bit number according to the quantization width determined in the quantization width determining step, and a message determining step of determining a message as information bits based on the probability distribution of the received value quantized in the quantizing step.

In the decoding method according to the present invention, therefore, the probability distribution of the received value is quantized with a predetermined low bit number according to the quantization width that is optimized so that the error probability after decoding becomes the minimum with respect to a given noise distribution or the noise distribution becomes the maximum with respect to a given error probability after decoding, and decoding is performed based on the quantized probability distribution of the received value. This achieves a significant improvement in code performance, and allows for high-precision decoding.

The invention claimed is:

1. A decoding device that decodes a code encoded by low-density parity check coding, said decoding device comprising:
   receiving means for receiving data as a received value;
   distribution determining means for determining a distribution of noise that is superposed on the data received by the receiving means;
   quantization width determining means for determining a quantization width that is optimized so that an error probability after decoding becomes the minimum with respect to the noise distribution determined by the distribution determining means or the noise distribution determined by the distribution determining means becomes the maximum with respect to a given error probability after decoding;
   quantizing means for quantizing a probability distribution of the received value received by the receiving means with a predetermined low bit number according to the quantization width determined by the quantization width determining means; and
   message determining means for determining a message as information bits based on the probability distribution of the received value quantized by the quantizing means.

2. A decoding device according to claim 1, wherein the message determining means quantizes a probability distribution of a message output from a variable node with a predetermined low bit number according to the quantization width determined by the quantization width determining means.

3. A decoding device according to claim 1, wherein the message determining means iterates a series of decoding operations a predetermined number of times, the series of decoding operations including determining a probability distribution of a message output from a variable node based on the probability distribution of the received value quantized by the quantizing means, and determining a probability distribution of a message output from a check node based on the determined probability distribution.

4. A decoding method for decoding a code encoded by low-density parity check coding, said decoding method comprising:
   a receiving step of receiving data as a received value;
   a distribution determining step of determining a distribution of noise that is superposed on the data received in the receiving step;
   a quantization width determining step of determining a quantization width that is optimized so that an error probability after decoding becomes the minimum with respect to the noise distribution determined in the distribution determining step or the noise distribution determined in the distribution determining step becomes the maximum with respect to a given error probability after decoding;
   a quantizing step of quantizing a probability distribution of the received value received in the receiving step with a predetermined low bit number according to the quantization width determined in the quantization width determining step; and
   a message determining step of determining a message as information bits based on the probability distribution of the received value quantized in the quantizing step.

5. A decoding method according to claim 4, wherein, in the message determining step, a probability distribution of a message output from a variable node is quantized with a predetermined low bit number according to the quantization width determined in the quantization width determining step.

6. A decoding method according to claim 4, wherein, in the message determining step, a series of decoding operations is iteratively performed a predetermined number of times, the series of decoding operations including determining a probability distribution of a message output from a variable node based on the probability distribution of the received value quantized in the quantizing step, and determining a probability distribution of a message output from a check node based on the determined probability distribution.

* * * * *